United States Patent
Liou

(10) Patent No.: US 11,837,244 B2
(45) Date of Patent: Dec. 5, 2023

(54) ANALYSIS FILTER BANK AND COMPUTING PROCEDURE THEREOF, ANALYSIS FILTER BANK BASED SIGNAL PROCESSING SYSTEM AND PROCEDURE SUITABLE FOR REAL-TIME APPLICATIONS

(71) Applicant: Invictumtech Inc., Diamond Bar, CA (US)

(72) Inventor: Ming-Luen Liou, Taipei (TW)

(73) Assignee: Invictumtech Inc., Diamond Bar, CA (US)

( * ) Notice: Subject to any disclaimer, the term of this patent is extended or adjusted under 35 U.S.C. 154(b) by 314 days.

(21) Appl. No.: 17/216,499

(22) Filed: Mar. 29, 2021

(65) Prior Publication Data

US 2022/0310105 A1 Sep. 29, 2022

(51) Int. Cl.
*G10L 19/02* (2013.01)
*H03H 17/02* (2006.01)
(Continued)

(52) U.S. Cl.
CPC ...... *G10L 19/0204* (2013.01); *G10L 21/0232* (2013.01); *G10L 25/18* (2013.01); *H03H 17/0266* (2013.01)

(58) Field of Classification Search
None
See application file for complete search history.

(56) References Cited

U.S. PATENT DOCUMENTS 9,294,060 B2 * 3/2016 Myllyla .............. G10L 21/038
10,477,313 B2 * 11/2019 Janse ...................... H04R 3/04
(Continued)

FOREIGN PATENT DOCUMENTS

| CN | 102169693 A | 8/2011 |
|---|---|---|
| TW | I338281 | 8/2006 |
| TW | I690220 | 1/2020 |

OTHER PUBLICATIONS

Wei, Ying, and Yong Lian. "A 16-band nonuniform FIR digital filter bank for hearing aid." 2006 IEEE Biomedical Circuits and Systems Conference. IEEE, 2006.
(Continued)

*Primary Examiner* — Pierre Louis Desir
*Assistant Examiner* — Nicole A K Schmieder
(74) *Attorney, Agent, or Firm* — Fei Hung Yang

(57) ABSTRACT

An analysis filter bank corresponding to multiple sub-bands, which performs frequency-division filtering on an input signal to generate multiple sub-band signals, the analysis filter bank comprising: a sub-band response pre-compensator which performs a linear filtering on the input signal to generate a response pre-compensated signal, multiple sub-filters with different central frequencies, which perform complex-type first-order infinite impulse response filtering respectively on the response pre-compensated signal to generate multiple sub-filter signals, and multiple binomially-combining and rotating devices based on a set of binomial weights, each of which performs a weighted summation on at least two of the sub-filter signals with the set of binomial weights, and rotates a weighted-summation result with a rotating phase according to a corresponding sub-band central frequency to generate one of the sub-band signals, wherein the at least two of the sub-filter signals are generated by at least two of the sub-filters adjacent in central frequency.

20 Claims, 10 Drawing Sheets

(51) Int. Cl.
*G10L 21/0232* (2013.01)
*G10L 25/18* (2013.01)

(56) References Cited

U.S. PATENT DOCUMENTS

| | | | |
|---|---|---|---|
| 11,308,969 B2* | 4/2022 | Davis | G10L 19/005 |
| 2013/0136266 A1* | 5/2013 | McClain | H03G 9/025 |
| | | | 704/E21.001 |
| 2015/0071463 A1* | 3/2015 | Niemisto | G10L 21/0224 |
| | | | 381/94.5 |
| 2017/0001007 A1* | 1/2017 | Meister | A61N 1/36038 |
| 2020/0090670 A1 | 3/2020 | Ghido et al. | |

OTHER PUBLICATIONS

Subbulakshmi, N., and R. Manimegalai. "A survey of filter bank algorithms for biomedical applications." 2014 International Conference on Computer Communication and Informatics. IEEE, 2014.
Necciari, Thibaud, et al. "A perceptually motivated filter bank with perfect reconstruction for audio signal processing." arXiv preprint arXiv:1601.06652 (2016).
Dutoit, T., Laroche, J. (2009). How does an audio effects processor perform pitch shifting?. In: Applied Signal Processing. Springer, Boston, MA. https://doi.org/10.1007/978-0-387-74535-0_5.
Loizou, Philipos C. Speech enhancement: theory and practice. CRC press, 2013.

* cited by examiner

ANALYSIS FILTER BANK AND COMPUTING PROCEDURE THEREOF, ANALYSIS FILTER BANK BASED SIGNAL PROCESSING SYSTEM AND PROCEDURE SUITABLE FOR REAL-TIME APPLICATIONS

TECHNICAL FILED

The present invention relates to the fields of acoustic signal processing and baseband signal processing, particularly relates to an analysis filter bank and a method thereof, and a filter-bank-based signal processing system and an implementation method thereof.

BACKGROUND

A filter bank consists of a plurality of parallel filters. The parallel filters respectively correspond to a plurality of different frequency bands, which cover the entire or part of the frequency bands of a time-domain input signal. Each of the frequency bands is referred to as a sub-band, and the set of all sub-bands is referred to as a sub-band set. The parallel filters are referred to as sub-band filters, and the output signal of the filter bank corresponding to each sub-band (i.e. the output signal of each sub-band filter) is referred to as a sub-band signal. The design of the filter bank is highly flexible. For example, the bandwidth and the response shape of each sub-band filter are independently adjustable, and the frequency responses of two sub-band filters adjacent in central frequency can be partially overlapped over frequency. The detail design of the filter bank can be referred to reference documents 1 to 3. If the sub-band filters of a filter bank share the same input signal, the filter bank is referred to as an analysis filter bank.

Filter banks can be employed in a signal processing system such as a conventional filter-bank-based signal processing system architecture 100 shown in FIG. 1. The signal processing system architecture 100 comprises: an analysis filter bank 101, which performs frequency-division filtering (i.e. multiple filtering operations with different central frequencies to separate a signal into different frequency components) on a time-domain input signal to obtain a plurality of sub-band signals; a decimator 102, which decimates (i.e. reduces the sampling rate by periodically discarding the samples of a signal) the sub-band signals to obtain a plurality of decimated sub-band signals; a core digital signal processing (hereinafter abbreviated as DSP) unit 103, which performs specified signal processing on the decimated sub-band signals to obtain a plurality of modified sub-band signals; a zero-padding unit 104, which incorporates zero-value samples into the modified sub-band signals to restore the sampling rate of the modified sub-band signals to that of the input signal; and a synthesis filter bank 105, which performs anti-aliasing on the modified sub-band signals with the restored sampling rate, and combines the anti-aliasing results into an output signal. The architecture of a filter-bank-based signal processing system (hereinafter referred to as filter-bank-based system) is applicable for the sample-based signal processing, which benefits to the system design with low processing delay. If the output signal of the signal processing system 100 is of real-type such as an acoustic signal, the synthesis of the output signal is usually performed on the real part of the modified sub-band signals. In addition, considering that the algorithms carried on the signal processing system 100 may require the phase information, such as the baseband signal processing algorithms, or the audio signal processing algorithms such as the frequency lowering and the phase vocoder algorithms, where the algorithms have to process the sub-band signals of complex type. Hence the sub-band signals of the analysis filter banks discussed below are of complex type by default.

Regarding the of architecture selection of the real-time signal processing system, besides the filter-bank-based system architecture, a frequency-domain signal processing system architecture based on an analysis-modification-synthesis (hereinafter abbreviated as AMS) framework is also commonly used. In the frequency-domain signal processing system based on the AMS framework (hereinafter referred to as AMS-based system), an analysis operation and a synthesis operation are a pair of reversible operations, such as the short-time Fourier transform (hereinafter abbreviated as STFT) and its inverse transform, or the discrete cosine transform (hereinafter abbreviated as DCT) and its inverse transform, etc. For detailed description of the waveform analysis and synthesis operations, please refer to reference documents 4 and 5. Because the frequency-domain signal processing is frame-based processing, the choice of a frame length directly affects the frequency resolution of the signal spectrums. If a real-time signal processing system is with a very low processing delay requirement, the AMS-based system architecture may not be applicable for implementing the system. The way to select an appropriate system architecture is nothing more than comparing several considerations and making a selection according to the system design requirements. Such considerations include: the ability of frequency division (decomposing the time domain waveform into signal components of different frequencies), the algorithm delay (i.e. the processing delay under zero arithmetic computation time assumption, also the theoretical lowest processing delay), the computation cost, the phase characteristics (such as whether it is close to linear phase response), the design flexibility (such as whether it causes extra restrictions on the design or parameter settings), the numerical stability (e.g., whether there is a special accuracy requirement such as only the floating-point arithmetic is applicable), etc. Generally, if the same frequency division ability (i.e. the same spectral resolution to be achieved) is considered, the computation cost of performing frequency-division filtering and waveform synthesis with the filter banks is significantly higher than that of performing with STFT and its inverse operations. However, the advantage of the filter-bank design is to achieve lower algorithm delay and high design flexibility (e.g., the number of sub-bands can be set to any positive integer, and the width and the frequency response of each sub-band can be independently specified, and the filter-bank design is applicable for both the sample-based and the frame-based processing systems). Therefore, a filter-bank design with low computation cost is a key to make the filter-bank-based system architecture appropriate for implementing a real-time signal processing software or implementing a low power signal processing device.

REFERENCES DOCUMENTS

Reference 1: Wei, Ying, and Yong Lian. "A 16-band non-uniform FIR digital filter bank for hearing aid." 2006 IEEE Biomedical Circuits and Systems Conference. IEEE, 2006.

Reference 2: Subbulakshmi, N., and R. Manimegalai. "A survey of filter bank algorithms for biomedical applications." 2014 International Conference on Computer Communication and Informatics. IEEE, 2014.

Reference 3: Necciari, Thibaud, et al. "A perceptually motivated filter bank with perfect reconstruction for audio signal processing." arXiv preprint arXiv:1601.06652 (2016).

Reference 4: Dutoit, Thierry, and Ferran Marques. Applied Signal Processing: A MATLAB™-based proof of concept. Springer Science & Business Media, 2010.

Reference 5: Loizou, Philipos C. Speech enhancement: theory and practice. CRC press, 2013.

SUMMARY

According to relative advantages and limitations of said different system architectures in the prior art, the purpose of the present invention is to provide an analysis filter bank and a computing procedure thereof suitable for real-time signal processing. The present invention also provides two signal processing systems and the computing procedures thereof according to the analysis filter bank and the computing procedure thereof. The analysis filter bank is based on the parallel first-order infinite impulse response (hereinafter abbreviated as IIR) filters, combined with the sub-band response pre-compensator and binomially-combining and rotating devices to form the sub-band signals of the analysis filter bank. The analysis filter bank and the computing procedure thereof are featured with low computation cost, low delay and low distortion. Hence, they are quite suitable for the implementation of filter bank systems in extremely low power devices or the implementation of real-time signal processing programs.

A first aspect of the present invention provides an analysis filter bank corresponding to a plurality of sub-bands, wherein the analysis filter bank performs frequency-division filtering on an input signal to generate a plurality of sub-band signals, the analysis filter bank comprising:
  a sub-band response pre-compensator, which performs linear filtering on the input signal to generate a response pre-compensated signal;
  a plurality of sub-filters with different central frequencies, which perform complex-type first-order IIR filtering respectively on the response pre-compensated signal to generate a plurality of sub-filter signals; and
  a plurality of binomially-combining and rotating devices based on a set of binomial weights, each of which performs a weighted summation on at least two of the sub-filter signals with the set of binomial weights, and rotates a weighted-summation result with a rotating phase according to a corresponding sub-band central frequency to generate one of the sub-band signals, or each of which rotates at least two of the sub-filter signals respectively with a rotating phase according to a corresponding sub-band central frequency and performs a weighted summation on at least two rotating results with the set of binomial weights to generate one of the sub-band signals,
wherein the at least two of the sub-filter signals are generated by at least two of the sub-filters adjacent in central frequency.

A second aspect of the present invention provides a two-section analysis filter bank comprising two analysis filter banks as:
  a low analysis filter bank according to the first aspect, which corresponds to a low sub-band set consisting of a plurality of sub-bands with central frequencies lower than a boundary frequency; and
  a high analysis filter bank according to the first aspect, which corresponds to a high sub-band set consisting of a plurality of sub-bands with central frequencies not lower than the boundary frequency,
wherein the two analysis filter banks perform frequency-division filtering respectively on an input signal to generate a plurality of sub-band signals, wherein the linear filtering of the sub-band response pre-compensator of the low analysis filter bank is low-pass filtering, and the linear filtering of the sub-band response pre-compensator of the high analysis filter bank is high-pass filtering.

A third aspect of the present invention provides a three-section analysis filter bank comprising three analysis filter banks as:
  a low analysis filter bank according to the first aspect, which corresponds to a low sub-band set consisting of a plurality of sub-bands with central frequencies lower than a low boundary frequency;
  a middle analysis filter bank according to the first aspect, which corresponds to a middle sub-band set consisting of a plurality of sub-bands with central frequencies between the low boundary frequency and a high boundary frequency; and
  a high analysis filter bank according to the first aspect, which corresponds to a high sub-band set consisting of a plurality of sub-bands with central frequencies higher than the high boundary frequency,
wherein the three analysis filter banks perform frequency-division filtering respectively on an input signal to generate a plurality of sub-band signals, wherein the linear filtering of the sub-band response pre-compensator of the low analysis filter bank is low-pass filtering, the linear filtering of the sub-band response pre-compensator of the middle analysis filter bank is band-pass filtering, and the linear filtering of the sub-band response pre-compensator of the high analysis filter bank is high-pass filtering.

A fourth aspect of the present invention provides a filter-bank-based signal processing system comprising:
  an analysis filter bank according to the first aspect, which performs frequency-division filtering on an input signal to generate a plurality of sub-band signals;
  a decimator, which decimates the sub-band signals or their amplitudes by a decimation ratio to generate an input spectrum;
  a core DSP unit, which performs specified DSP operations on the input spectrum to determine a plurality of sub-band weights corresponding to the sub-band signals; and
  a sub-band combiner, which performs a weighted summation on the sub-band signals or their real part with the sub-band weights to generate an output signal.

A fifth aspect of the present invention provides a hybrid-type signal processing system comprising:
  a framing and time-to-frequency transform device, which divides an input signal into a plurality of signal frames with equal frame length and equal frame spacing in time, and performs a time-to-frequency transform on each signal frame to generate a plurality of band signals;
  a plurality of analysis filter banks according to the first aspect, which perform frequency-division filtering respectively on the band signals to generate a plurality of sub-band signals;
  a decimator which decimates the sub-band signals or their amplitudes by a decimation ratio to generate an input spectrum;
  a core DSP unit, which performs specified frequency-domain signal processing on the input spectrum to determine a plurality of sub-band weights of the sub-band signals corresponding to each of the band signals;

a plurality of sub-band combiners, each of which performs a weighted summation on the sub-band signals corresponding to one of the band signals with the sub-band weights of the sub-band signals corresponding to the band signal to generate one of a plurality of modified band signal; and a frequency-to-time transform device, which performs a frequency-to-time transform on a plurality of concurrent samples of the modified band signals to generate an output signal.

A sixth aspect of the present invention provides a filter-bank computing procedure corresponding to a plurality of sub-bands, comprising the following steps:

performing a linear filtering operation on an input signal to obtain a response pre-compensated signal;

performing a plurality of complex-type first-order IIR filtering operations with different central frequencies respectively on the response pre-compensated signal to obtain a plurality of sub-filter signals; and performing a weighted summation with a set of binomial weights on a plurality of concurrent samples of each of a plurality of subsets of the sub-filter signals, and rotating each weighted summation result with a rotating phase according to a corresponding sub-band central frequency to obtain one of a plurality of sub-band signals, or rotating a plurality of concurrent samples of each of the subsets of the sub-filter signals with a rotating phase according to a corresponding sub-band central frequency, and performing a weighted summation with a set of binomial weights on a plurality of rotated samples to obtain one of the sub-band signals, wherein the subsets of the sub-filter signals respectively corresponds to the sub-bands, each subset of the sub-filter signals consists of an at least two number of the sub-filter signals obtained by the at least two number of the sub-filters adjacent in central frequency.

A seventh aspect of the present invention provides a filter-bank-based signal processing system procedure, comprising the following steps:

executing the filter-bank computing procedure according to the sixth aspect on an input signal to obtain a plurality of sub-band signals;

decimating the sub-band signals or their amplitudes to obtain an input spectrum, and executing a core DSP procedure on the input spectrum to determine a plurality of sub-band weights corresponding to the sub-band signals; and performing a weighted summation with the sub-band weights on a plurality of concurrent samples of the sub-band signals or their real part to obtain an output signal.

An eighth aspect of the present invention provides a hybrid-type signal processing system procedure, comprising the following steps:

performing at least one time-to-frequency transform respectively on at least one signal frame of an input signal to obtain a plurality of band signals corresponding to a plurality of frequency bands;

executing the filter-bank computing procedure according to the sixth aspect on each of the band signals to obtain a plurality of sub-band signals;

decimating the sub-band signals or their amplitudes to obtain an input spectrum, and executing a core DSP procedure on the input spectrum to determine a plurality of sub-band weights of the sub-band signals corresponding to the band signals;

for each of the frequency bands, performing a weighted summation with the corresponding sub-band weights on a plurality of concurrent samples of the corresponding sub-band signals to obtain one of a plurality of modified band signals; and performing a frequency-to-time transform on a plurality of concurrent samples of the modified band signals to obtain an output signal.

DETAILED DESCRIPTION

To make the present invention better understood by those skilled in the art to which the present invention pertains, preferred embodiments of the present invention are detailed below with the accompanying drawings to clarify the content of the present invention and effects to be achieved thereof.

Figure 2:
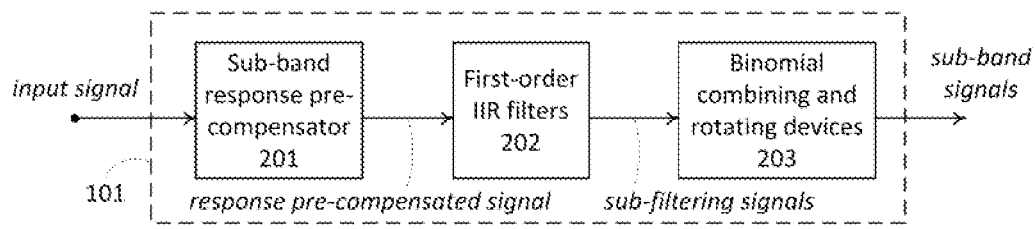
FIG. 2 is a block diagram of an analysis filter bank according to a first embodiment of the present invention.

FIG. 2 is a block diagram of an analysis filter bank according to a first embodiment of the present invention. The analysis filter bank 101 corresponds to S sub-bands numbered from low to high according to the sub-band central frequencies. The analysis filter bank 101 comprises K parallel first-order IIR sub-filters 202, S binomially-combining and rotating devices based on a set of $M^{th}$-order binomial weights (hereinafter referred to as $M^{th}$-order binomially-combining and rotating device) 203, and an optional sub-band response pre-compensator 201. Under this structure, each sub-band signal is generated by a corresponding $M^{th}$-order binomially-combining and rotating device, wherein the device performs a weighted summation on the subset of the output signals of the IIR sub-filters (hereinafter referred to as the sub-filter signals) with the set of $M^{th}$-order binomial weight. It is functionally equivalent to pass an input signal through a plurality of independent filters corresponding to the sub-bands (hereinafter referred to as sub-band equivalent filters) respectively to generate the sub-band signals.

The sub-band response pre-compensator 201 is designed to improve the frequency responses of the sub-band equivalent filters of the analysis filter bank 101, wherein the sub-band response pre-compensator 201 performs linear filtering on the input signal of the analysis filter bank 101 to generate a response pre-compensated signal. The filter is a linear filter with few fixed non-trivial coefficients, which uses a small amount of computations to counter the common weakness on the frequency responses of the sub-band equivalent filters (e.g., poor stopband attenuation levels, higher passband gain/group delay fluctuation, etc.) caused by certain settings (e.g., the widths of sub-band, the number of sub-filter signals shared by two adjacent sub-bands, etc.). Such compensation has to be adjusted with the settings, hence the equation of the sub-band response pre-compensator 201 will be shown with each embodiment of the analysis filter bank 101 introduced in the following paragraphs.

The parallel first-order IIR sub-filters 202 have different central frequencies and are numbered according to the central frequencies from low to high. The IIR sub-filters 202 perform complex-type first-order IIR filtering respectively on the response pre-compensated signal to generate a plurality of sub-filter signals, expressed as:

$$y_{IIR,k}[n]=b_k \cdot \hat{x}[n]-a_k \cdot y_{IIR,k}[n-1], \forall k \in [1,K] \quad (1)$$

where k denotes the No. of the IIR sub-filter, n denotes the sample time index, $\hat{x}$ denotes the response pre-compensated signal, $y_{IIR,k}$ denotes the No. k sub-filter signal, $a_k$ and $b_k$ denote the complex-type feedback coefficient and the real-type feed-forward coefficient of the No. k IIR sub-filter respectively, set as:

$$a_k = \left(1 - \frac{BW_{IIR,k}}{f_{SAM}}\right) \cdot \exp\left[j\left(2\pi \cdot \frac{f_{IIR,k}}{f_{SAM}}\right)\right] \quad (2)$$

$$b_k = \rho \cdot \left(\frac{BW_{IIR,k}}{f_{SAM}}\right)^\mu \quad (3)$$

where f_(IIR,k) and BW_(IIR,k) denote the central frequency and bandwidth (*) of the No. k IIR sub-filter respectively, and f SAM denotes the sampling rate of the input signal of the analysis filter bank. μ and ρ denote the two parameters of the IIR sub-filters 202, wherein μ is adjusted to maintain the flatness of the sum of the sub-band frequency responses (hereinafter referred to as the overall response) of the analysis filter bank 101 in the frequency range of the sub-bands, and ρ is adjusted to keep the average gain of the overall response of the analysis filter bank 101 close to 0 dB.

*: The bandwidth of each of the IIR sub-filters 202 depends on the width of at least one corresponding sub-band. For example, in a design with equal-width sub-bands, the bandwidths of the IIR sub-filters 202 are identical. In a design where the sub-band width increases with the sub-band central frequency, the bandwidth of each of the IIR sub-filters 202 increases with the central frequency of the sub-filter.

Each of the $M^{th}$-order (M≥1) binomially-combining and rotating devices 203 performs a weighted summation on M+1 of the sub-filter signals with the set of $M^{th}$-order binomial weights, and rotates a result of the weighted-summation with a rotating phase according to a corresponding sub-band central frequency to generate one of the sub-band signals (note the sub-bands are numbered according to their central frequencies from low to high, hence the rotating phase can be set proportional to the sub-band No. s). The M+1 of the sub-filter signals are generated by the M+1 of the IIR sub-filters 202 adjacent in central frequency (i.e., the M+1 of the IIR sub-filters 202 are consecutively numbered). The $M^{th}$ weight of the set of $M^{th}$-order binomial weights is the $m^{th}$ coefficient of the polynomial expansion of $(1-x)^M$:

$$B_{M,m} = (-1)^m \cdot \frac{M!}{m!(M-m)!}, \forall M \geq 1 \quad (4)$$

The calculation of the $M^{th}$-order binomially-combining and rotating devices 203 is expressed as:

$$y_{FB,s}[n] = \exp(j\theta \cdot s) \sum_{m=0}^{M} B_{M,m} \cdot y_{IIR,k_s+m}[n], \forall s \in [1, S] \quad (5)$$

where s denotes the No. of binomially-combining and rotating device (also the No. of the corresponding sub-band), $y_{FB,s}$ denotes the No. s sub-band signal of the analysis filter bank 101, θ denotes the difference between the rotating phases of two binomially-combining and rotating devices corresponding to any two sub-bands adjacent in central frequency (i.e. any two consecutively numbered sub-bands) where the unit is radian, $k_s$ denotes the lowest No. of the sub-filter signals applied by the No. s binomially-combining and rotating device, $y_{IIR,k_s}$+m denotes the No. $k_s$+m sub-filter signal, and other notations are as aforementioned.

In equation (5) the phase-rotation term is aimed to adjust the overall response of the analysis filter bank 101 to make the sub-band signals approximately coherent (i.e. to avoid destructive combining) and to reduce the output delay of the analysis filter bank 101. The setting of θ is basically not limited, but a setting of integer multiple of −π/2 may further decrease the group delay and the group delay fluctuation of the overall response of the analysis filter bank 101. In the following examples of the present invention, the setting of θ=−π/2 is adopted so that the phase rotation is simply interchanging the real part/imaginary part or changing the sign of a complex-type signal. The overall response is improved without extra multiplication cost.

In addition, the IIR filtering operations, the weighted summations, and the phase rotations are all linear operations. These operations can be either combined, arbitrarily changed the order, or even incorporated into the previous/subsequent blocks outside the analysis filter bank without altering the system functionality. FIG. 2 and equations (1) and (5) only show one of the possible structures of the analysis filter bank.

Next, the way of sharing the sub-filter signals between the combining and rotating devices will be discussed. Consider that two of the $M^{th}$-order binomially-combining and rotating devices 203 with any two consecutive No. (i.e. they correspond to two of the sub-bands adjacent in central frequency) share P sub-filter signals, then $k_s$ can be expressed as:

$$k_s = (M-P+1) \cdot (s-1) + 1, \ 0 \leq P < M \tag{6}$$

where the notations are as aforementioned. The number of sub-filter signals in the analysis filter bank 101 is K=(M−P+1)·S+P, and the proportion of the number of shared sub-filter signals is about P/(M+1). In short, assuming that the number of sub-band signals and the order of binomially-combining and rotating devices are fixed, the higher proportion of the number of shared sub-filter signals, the fewer IIR sub-filters required by the analysis filter bank 101 and the flatter the overall response. However, such higher proportion also implies the increasing of the frequency response overlapping among the sub-band equivalent filters, which is not beneficial to subsequent signal processing. Therefore, it is recommended to set P as a small positive integer but not zero (P=0 means that each sub-filter signal is used by one combining and rotating device instead of being shared by multiple binomially-combining and rotating devices).

Figure 3:
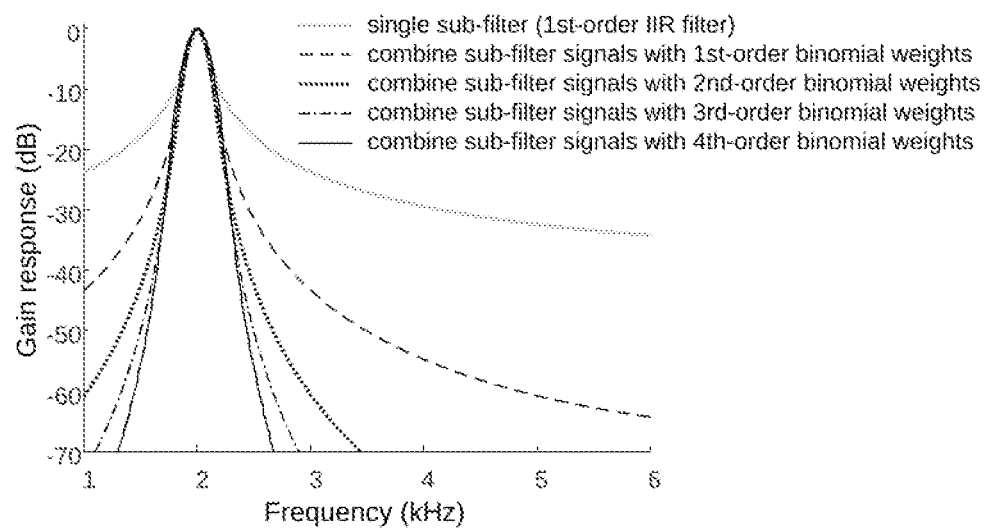
FIG. 3 is a frequency response plot of the sub-band equivalent filters obtained by performing weighted summation on consecutively numbered sub-filter signals with five sets of binomial weights of different orders.

The reason of employing higher-order binomially-combining (M≥1) is to increase the stopband attenuation levels and transition band attenuation slopes of the frequency responses of the sub-band equivalent filters. FIG. 3 shows the frequency responses of the sub-band equivalent filters obtained by performing weighted summation on consecutively numbered sub-filter signals with five sets of binomial weights of different orders. As shown in FIG. 3, the stopband attenuation level of a first-order IIR filter response is only about 20 to 30 dB. Through the binomially weighted summations, the stop-band attenuation levels and transition-band attenuation slopes of the frequency response of the sub-band equivalent filters can be increased by multiples (≥2). While the drawback is that the group delays of the frequency responses of the sub-band equivalent filters and overall response of the analysis filter bank are also increased by multiples. Therefore, the applicability of employing higher-order binomially-combining has to be considered in conjunction with system applications. In practice, the applicable frequency response characteristics of the sub-band equivalent filters can be obtained by employing the first- or second-order binomially-combining.

Next, an analysis filter bank with equal-width sub-band configuration will be discussed. Because of the equal-width sub-bands, the IIR sub-filters of the analysis filter bank 101 are with identical bandwidth, and the central frequencies of the sub-filters are equally spaced over frequency. It makes the response shapes of the sub-band equivalent filters (including the gain response and group delay response) with high similarity, and makes the overall response of the analysis filter bank 101 periodically fluctuate over frequency. To improve the flatness of the frequency responses the sub-band equivalent filters and the overall response of the analysis filter bank 101, the following linear filtering of the sub-band response pre-compensator is performed:

$$\hat{x}[n] = x[n] + C_{CMP} \cdot x[n-D], \ D = \text{round}\left(\frac{f_{SAM}}{BW_{SB}}\right) \tag{7}$$

i.e., by summing the input signal and its weighted-and-delayed version, where x denotes the input signal of the analysis filter bank 101, $\hat{x}$ denotes the output signal of the sub-band response pre-compensator 201, D denotes the length of the impulse response (the unit is sample) of the sub-band response pre-compensator 201, $BW_{SB}$ denotes the width of each sub-band, round(·) denotes the integer rounding function, $C_{CMP}$ denotes a real-type parameter, and other notations are as aforementioned. The purpose of adjusting the parameter $C_{CMP}$ is to eliminate the gain and group delay fluctuation of the overall response of the analysis filter bank 101 (setting $C_{CMP}$ to 0 makes the sub-band response pre-compensator 201 inactive). In addition, since the IIR sub-filters 202 are with the same bandwidth, the corresponding feed-forward coefficients ($b_k$) are identical according to equation (3). Therefore, the multiplication of $b_k$ can be moved away from the filter equation (1) (e.g., incorporated into the sub-band response pre-compensator 201) to simplify the computations of the IIR sub-filters 202.

Figure 4:
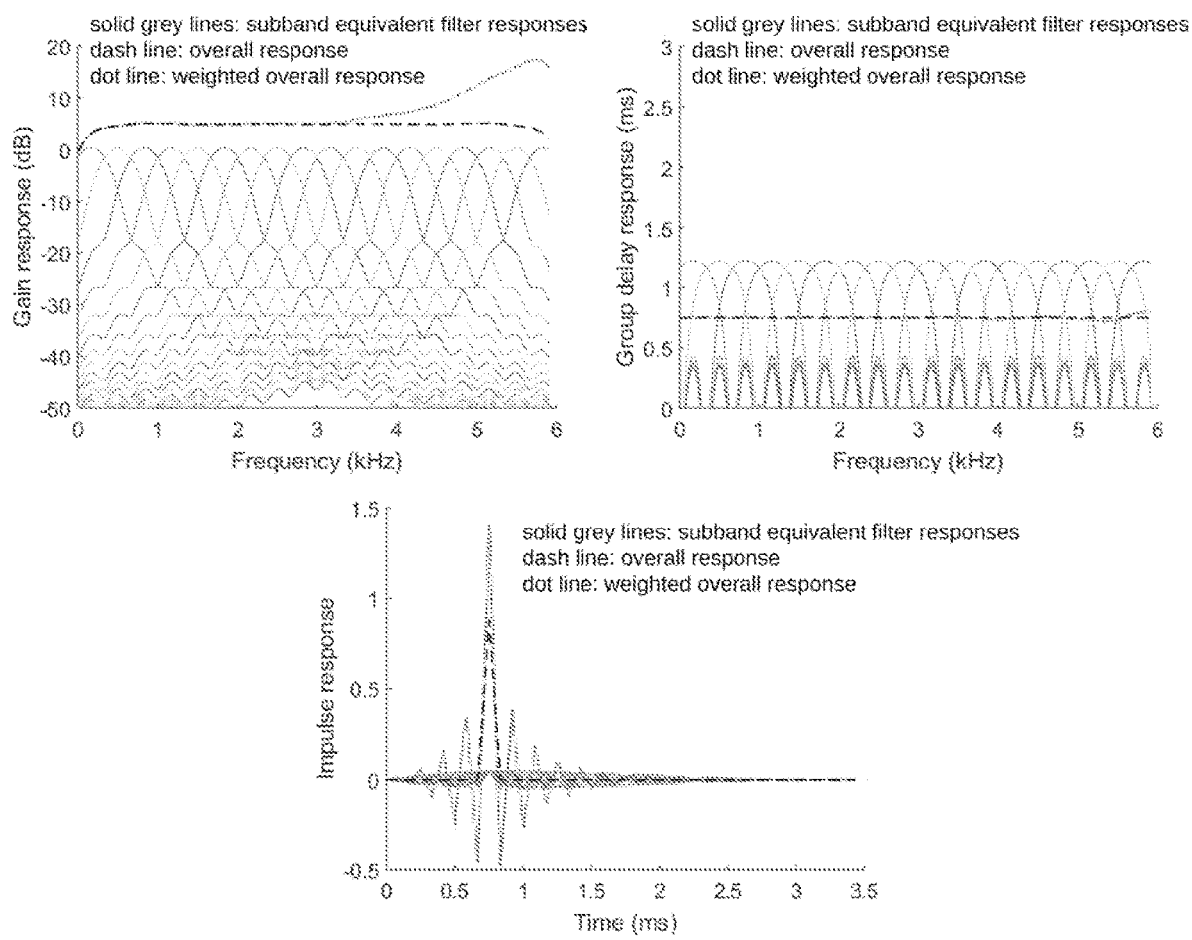
FIG. 4 is a set of response plots of an analysis filter bank employing first-order binomially-combining and rotating devices.

FIG. 4 shows the responses of an analysis filter bank employing first-order binomially-combining and rotating devices (the solid lines represent the frequency responses of the sub-band equivalent filters, the dashed line represents the overall response, and the dotted line represents the overall response obtained by gradually increasing the sub-band weights toward high frequency). The sampling rate of the input signal of the analysis filter bank is 12 kHz. The frequency range from zero frequency (DC) to Nyquist frequency (half of the sampling rate, also the highest frequency of the input signal) is divided into 18 equal-width sub-bands, hence the width of each sub-band is 333 Hz. The analysis filter bank 101 contains 19 first-order IIR sub-filters, and each sub-band signal is composed of two equal-bandwidth sub-filter signals, wherein the central frequencies of the two IIR sub-filters are located at the boundaries between the sub-band and two adjacent sub-bands.

Figure 5:
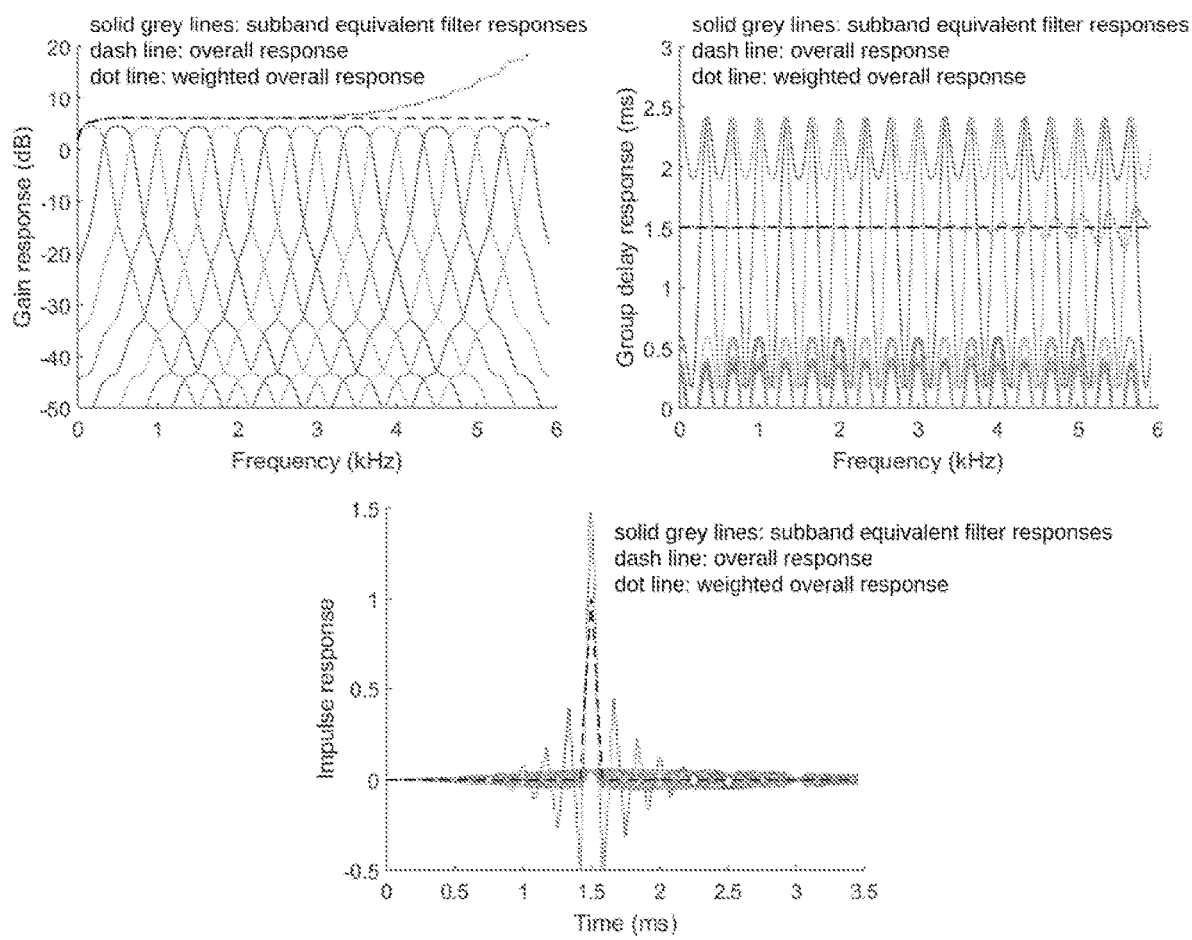
FIG. 5 is a set of response plots of an analysis filter bank employing second-order binomially-combining and rotating devices.

FIG. 5 shows the responses of an analysis filter bank employing second-order binomially-combining and rotating devices (in FIG. 5 the solid lines represent the frequency responses of the sub-band equivalent filters, the dashed line represents the overall response, and the dotted line represents the overall response obtained by gradually increasing the sub-band weights toward high frequency). The sampling rate of the input signal and the sub-band definitions (number of sub-bands, sub-band frequency range/width) of the analysis filter bank are the same as the above example. The analysis filter bank contains 37 first-order IIR sub-filters, and each sub-band signal is composed of three sub-filter signals, wherein the central frequencies of two IIR sub-filters are located at the boundaries between the sub-band and the two adjacent sub-bands, and the central frequency of the third IIR sub-filter is located at the center of the sub-band. In the above examples, the filter bank settings with fewer sub-bands are employed to make the graphs clear. In practice, a filter bank is usually with more sub-bands.

Compared with the example of employing first-order binomial combining and rotating devices, the example of employing second-order binomially-combining and rotating devices render steeper transition-band and slightly wider/ flatter passband characteristics in the gain responses of the sub-band equivalent filters. While rendering the better response characteristics is with a cost of doubling the number of complex-type multiplications, and doubling the filter group delay as well. In addition, regardless of employing the first-order or second-order binomially-combining and rotating devices, the overall responses (including the gain responses and group delay responses) of the two examples of analysis filter banks are quite flat and approximately linear phase (*). The sum of the impulse responses of all sub-band equivalent filters (i.e., the overall impulse response) of each analysis filter bank is almost an impulse function without linear distortion. On the premise of no additional gain applied on each sub-band signal, the summation of sub-band signals approximates the input waveform with a short delay. However, the higher-order the binomial combining employed, the more sensitive the frequency responses of the filter-bank-based system to the changes of the sub-band weights, and the stronger the overall response fluctuation (including the gain fluctuation and group delay fluctuation).

(*): Note the frequency response of each of the individual sub-band equivalent filters is neither flat nor linear phase. Also, the group delay of each of the sub-band equivalent filters may be higher than that of the overall response of the analysis filter bank.

In practice, an analysis filter bank with fairly good stopband attenuation levels and transition band attenuation slopes on the frequency responses of the sub-band equivalent filters can be obtained by employing either first- or second-order binomial and rotating devices. The advantage of employing higher-order binomially-combining and rotating devices is to provide a higher stopband attenuation level, (about 20 to 30 dB increment on the stopband attenuation level per order increasing), a higher transition band attenuation slope, and a relatively flatter passband to the frequency response of each of the sub-band equivalent filters. While the disadvantages are: 1) decreasing the proportion of the number of shared sub-filter signals, which means the overall computations are increased, 2) increasing the group delay of the frequency responses of the sub-band equivalent filters as well as the overall response of the analysis filter bank, and 3) enhancing the group delay response fluctuation of the overall response when the weights on the sub-band signals provided by the signal processing algorithms are nontrivial. Therefore, it is recommended to design the analysis filter bank by employing the first- or second-order binomially-combining and rotating devices unless an extremely high stopband attenuation level is required.

The analysis filter bank 101 can be configured with unequal-width sub-bands, which is often used in audio processing. In short, a human hearing system possesses a tonotopic organization with frequency-division filtering ability, generally referred to as an auditory filter. The auditory filters of normal hearing listeners show a filtering effect with wider bandwidth against higher frequency signals while roughly constant-bandwidth against lower frequency signals. The bandwidths are generally referred to as the critical band bandwidths. In the literature, the filter bank of the audio processing system is usually designed to approximate the behavior of the auditory filter; that is, the sub-band filters with low central frequencies (e.g. 500 Hz or below) are configured with narrow and nearly-equal bandwidths while the sub-band filters with higher central frequencies are configured with gradually wider bandwidths. The design equations of said analysis filter bank (1) to (6) are still applicable under unequal-width sub-band configurations. Two reminders for designing the analysis filter bank:

In an analysis filter bank with an equal-width sub-band configuration, the IIR sub-filters 202 are with identical bandwidth and the sub-filter central frequencies are evenly spaced over frequency. Hence the filter equation can be simplified (because $b_k$ values are identical for all k, the multiplication of $b_k$ in equation (1) can be moved away, for example, by multiplying the input signal with $b_k$ before sending to the analysis filter bank 101). However, the computations of the analysis filter banks under unequal-width sub-band configurations cannot be simplified in the same way.

In an analysis filter bank with an unequal-width sub-band configuration, the sub-band response pre-compensator 201 cannot effectively eliminate the frequency response fluctuation. Under the circumstance, it is recommended to disable the function of the sub-band response pre-compensator 201 (e.g., set $C_{CMP}$=0, or use the input signal of the analysis filter bank as the input of the IIR sub-filters 202) and increase the bandwidths of the IIR sub-filters 202 to reduce the fluctuation of the overall response (including the gain response and group delay response) of the analysis filter bank 101, with the cost of slightly increasing the transition band width of the frequency response of each of the sub-band equivalent filters.

Figure 6:
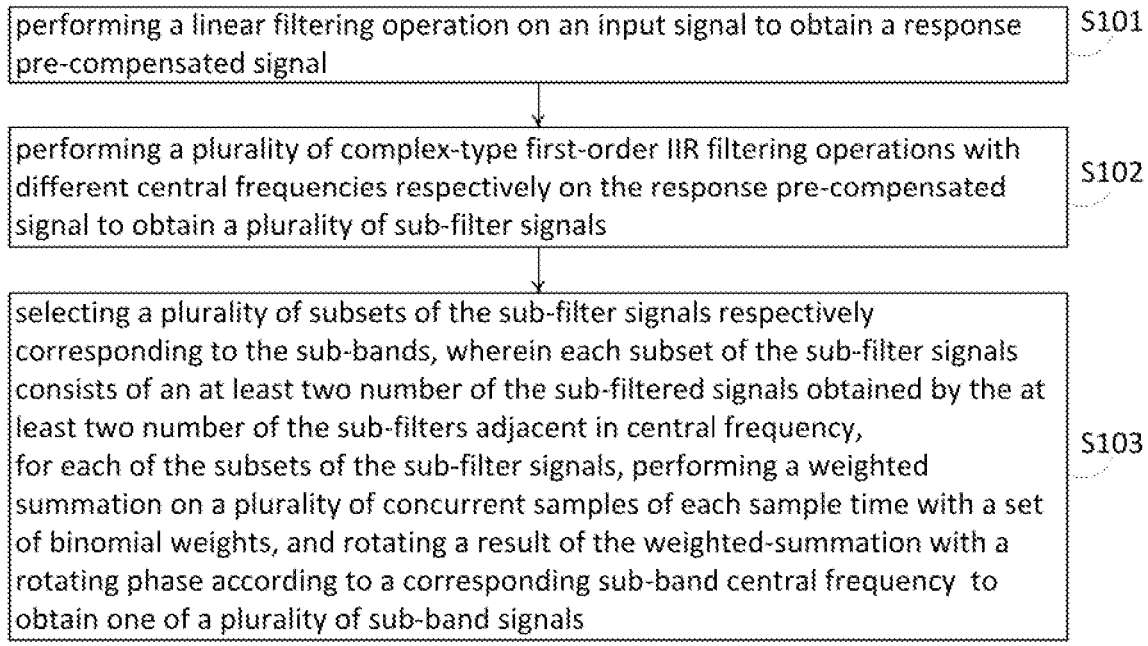
FIG. 6 is a flowchart of the filter-bank computing procedure according to a second embodiment of the present invention.

In addition to be implemented as a physical device, the functions of the analysis filter bank 101 can be realized by an equivalent computing procedure executed on at least one processor. FIG. 6 is a flowchart of a filter-bank computing procedure according to a second embodiment of the present invention. The filter-bank computing procedure corresponds to a plurality of sub-bands, which are numbered from low to high according to sub-band central frequencies. The flow steps focus on the processing method of a segment of a continuous input signal because the signal is segmentally processed for each step to support a real-time application, i.e., each step processes an output signal segment just obtained by the previous step instead of waiting the entire output signal obtained by the previous step. In describing the flow steps of the filter-bank computing procedure, equations (1) to (7) and the corresponding paragraphs are referred.

In FIG. 6, a linear filtering operation is performed on an input signal to obtain a response pre-compensated signal (step S101), where the input signal consists of at least one sample, and the response pre-compensated signal consists of at least one sample. Referring to paragraphs [0017] and [0024], the linear filtering operation corresponds to the calculation of equation (7), which is aimed to reduce the frequency response fluctuation of the sub-band equivalent filters and the overall response (including the gain response and group delay response).

A plurality of complex-type first-order IIR filtering operations with different central frequencies are respectively performed on the response pre-compensated signal to obtain a plurality of sub-filter signals (step S102). Referring to paragraph [0018], the complex-type first-order IIR filtering operations correspond to the calculation of equations (1) to (3). Each of the sub-filter signals consists of at least one sample.

A plurality of subsets of the sub-filter signals respectively corresponding to the sub-bands are selected, wherein each subset of the sub-filter signals consists of an at least two number of the sub-filtered signals obtained by the at least two number of the sub-filters adjacent in central frequency. For each of the subsets of the sub-filter signals, a weighted summation is performed on a plurality of concurrent samples of each sample time with a set of binomial weights. In addition, a result of the weighted-summation is rotated with a rotating phase according to a corresponding sub-band central frequency to obtain one of a plurality of sub-band signals, where each sub-band signal consists of at least one sample (step S103). Referring to paragraph [0019], the binomial weights corresponds to equation (4), and the weighted summation and the phase rotation correspond to equation (5). Referring to paragraph [0020], θ (the difference between the rotating phases of two binomially-combining and rotating devices corresponding to any two sub-bands adjacent in central frequency) is set as an integer multiple of $-7\pi/2$ radian. Regarding the phase rotations corresponding to any two sub-bands adjacent in central frequency, the difference between the two corresponding rotating phases is consequently an integer multiple of $-7\pi/2$ radian. Referring to paragraph [0022], since any two consecutively numbered binomial combing and rotating devices share P of the sub-filter signals, two subsets of the sub-filter signals corresponding to any two sub-bands adjacent in central frequency share P of the sub-filter signals.

An issue potentially arises when the analysis filter bank 101 is configured with unequal-width sub-bands. In an audio processing application, the widths of high frequency sub-bands are usually much wider than that of the lower frequency sub-bands. As first-order or second-order binomial combining employed, the frequency responses of the higher-central-frequency sub-band equivalent filters of the analysis filter bank 101 configured with unequal-width sub-bands may exhibit over-wide transition bands/insufficient stopband attenuations (such as under 40 dB), which may deteriorate the performance of part of the signal processing algorithms.

Figure 7:
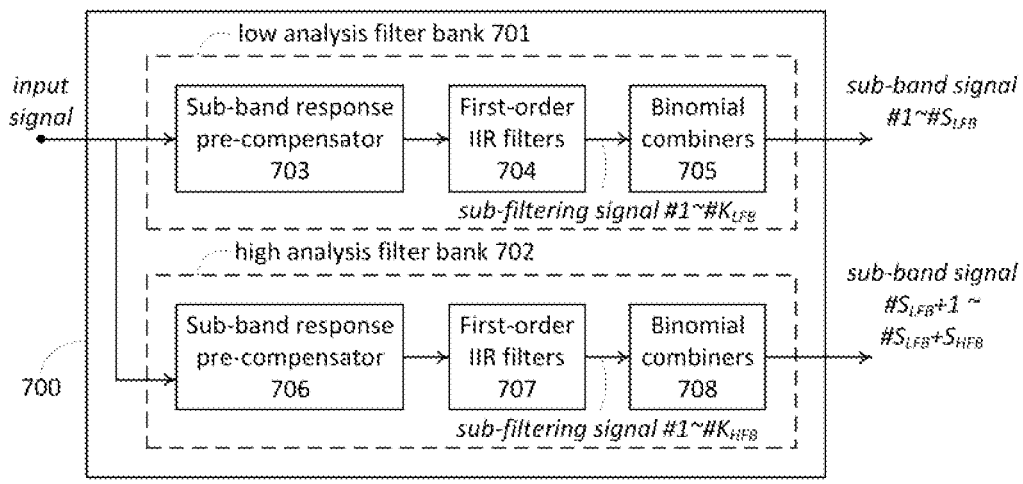
FIG. 7 is a block diagram of a two-section analysis filter bank according to a third embodiment of the present invention.

To overcome the issue, a third embodiment of the present invention provides a two-section analysis filter bank 700 composed of two said analysis filter banks in parallel as shown in FIG. 7. The two analysis filter banks, a low analysis filter bank 701 and a high analysis filter bank 702, respectively correspond to a low sub-band set and a high sub-band set, where the frequency ranges of the two sub-band sets are separated by a boundary frequency $f_{BND}$ (*). The low sub-band set consists of $S_L$ sub-bands where all sub-band central frequencies are lower than $f_{BND}$; the high sub-band set consists of $S_H$ sub-bands where all sub-band central frequencies are not lower than $f_{BND}$. Each of the two sub-band sets can be configured as either unequal-width, equal-width, or partially-equal-width sub-bands. The two analysis filter banks 701 and 702 perform frequency-division filtering respectively on an input signal to generate a plurality of sub-band signals.

(*): The boundary frequency $f_{BND}$ should be set so that the high sub-band set includes the wide high-frequency sub-bands which exhibit insufficient stop-band attenuation on the low-frequency side of the frequency responses of the corresponding sub-band equivalent filters and also includes the middle-to-high frequency sub-bands where the corresponding sub-band signals are potentially greatly amplified for hearing loss compensation.

In order to make the overall response of the two-section analysis filter bank 700 (including the gain response and group delay response) smooth and continuous at the boundary frequency, the following design constraints are added:

For each of the two analysis filter banks 701 and 702, the binomially-combining and rotating devices are of $M^{th}$-order (i.e. based on $M^{th}$-order binomial weights), and any two of the binomially-combining and rotating devices with consecutive No. (i.e. corresponding to two of the sub-bands adjacent in central frequency) share P sub-filter signals.

The phase difference between two frequency responses of two sub-band response pre-compensators 703 and 706 at each frequency is a fixed value of integer multiple of $7\pi/2$ (to achieve this, two linear-phase filters with identical group delay response can be employed as the two sub-band response pre-compensators). In this way, the boundary frequency $f_{BND}$ can be arbitrarily chosen without increasing the computation cost of the phase rotations of the binomial combining and rotating devices 705 and 708.

The highest-central-frequency IIR sub-filter of the low analysis filter bank 701 and the lowest-central-frequency IIR sub-filter of the high analysis filter bank 702 have identical central frequency and bandwidth settings, expressed as:

$$\begin{cases} f_{LIIR,K_L} = f_{HIIR,1} \\ BW_{LIIR,K_L} = BW_{HIIR,1} \end{cases} \tag{8}$$

where $K_L$ denotes the number of IIR sub-filters of the low analysis filter bank 701, $f_{LIIR,K_L}$ and $BW_{LIIR,K_L}$ denote the central frequency and bandwidth of the No. $K_L$ IIR sub-band filter of the low analysis filter bank 701 respectively, and $f_{HIIR,1}$ and $BW_{HIIR,1}$ denote the central frequency and bandwidth of the No. 1 IIR sub-filter of the high analysis filter bank 702 respectively.

In the low analysis filter bank 701, the linear filtering of the sub-band response pre-compensator 703 is low-pass filtering to increase the out-of-band suppression of each sub-band equivalent filter of the low analysis filter bank 701 at the high frequency side, the low-pass filtering is calculated as:

$$\hat{x}_L[n] = x[n] + x[n-1] \tag{9}$$

where $\hat{x}_L$ denotes the output signal of the sub-band response pre-compensator 703, and other notations are as aforementioned. In order to support the operation of the sub-band response pre-compensator 703 of equation (9), the $b_k$ settings of the IIR sub-filters 704 are modified as:

$$b_k = \frac{\rho}{\left|1 + e^{j\Omega}\right|} \cdot \left(\frac{BW_{LIIR,k}}{f_{SAM}}\right)^\mu, \Omega = 2\pi \cdot \frac{f_{LIIR,k}}{f_{SAM}} \tag{10}$$

where $f_{LIIR,k}$ and $BW_{LIIR,k}$ denote the central frequency and bandwidth of the No. k IIR sub-filter of the low analysis filter bank 701 respectively, and other notations are as aforementioned. The IIR sub-filters 704 are calculated according to equations (1), (2) and (10) (where $\hat{x}$ is substituted by $\hat{x}_L$), and the sub-band signals of the low analysis filter bank 701 are calculated according to equations (4) to (6) (where the range of s is between [1, $S_L$]). Each sub-band signal of the low analysis filter bank 701 is the sub-band signal of the two-section analysis filter bank 700 with the same No.

In the high analysis filter bank 702, the linear filtering of the sub-band response pre-compensator 706 is high-pass filtering to increase the out-of-band suppression of the sub-band equivalent filters of the high analysis filter bank 702 at the low frequency side, the high-pass filtering is calculated as:

$$\hat{x}_H[n] = x[n] - x[n-1] \tag{11}$$

where $\hat{x}_H$ denotes the output signal of the sub-band response pre-compensator 706, and other notations are as aforementioned. To support the operation of the sub-band response pre-compensator 706 of equation (11), the $b_k$ settings of the IIR sub-filters 707 are modified as:

$$b_k = \frac{\rho}{|1 - e^{j\Omega}|} \cdot \left(\frac{BW_{HIIR,k}}{f_{SAM}}\right)^\mu, \Omega = 2\pi \cdot \frac{f_{HIIR,k}}{f_{SAM}} \quad (12)$$

where $f_{LIIR,k}$ and $BW_{LIIR,k}$ denote the central frequency and bandwidth of the No. k IIR sub-filter of the high analysis filter bank 702 respectively, and other notations are as aforementioned. The IIR sub-filters 707 are calculated according to equations (1), (2), and (11) (where $\hat{x}$ is substituted by $\hat{x}_H$). The No. s sub-band signal of the high analysis filter bank 702 is the No. $S_L$+s sub-band signal of the two-section analysis filter bank 700, calculated as:

$$\varphi_{H,s} = -\frac{\pi}{2} + \theta \cdot (S_L + s) \quad (13)$$

$$y_{FB,S_L+s}[n] = \exp(j\varphi_{H,s}) \cdot \sum_{m=0}^{M} B_{M,m} \cdot y_{HIIR,k_s+m}[n] \quad (14)$$

where $\varphi_{H,s}$ denotes the rotating phase of the No. s sub-band signal, $k_s$ denotes the lowest No. of the sub-filter signals selected by the No. s combining and rotating device of the high analysis filter bank 702, $y_{HIIR,k_s+m}$ denotes the No. $k_s$+m sub-filter signal of the high analysis filter bank 702, $y_{FB,S_L+s}$ denotes the No. $S_L$+s sub-band signal of the two-section analysis filter 700, and other notations are as aforementioned. $B_{M,m}$ and $k_s$ are calculated according to equations (4) and (6) respectively (where the range of s is between [1, $S_H$]).

In addition to be implemented as a physical device, the functions of the two-section analysis filter bank 700 can be realized by a two-section filter-bank computing procedure executed on at least one processor. The two-section filter-bank computing procedure executes two said filter-bank computing procedures corresponding to the two sub-band sets respectively on at least one sample of an input signal to obtain a plurality of sub-band signals. Refer to paragraph [0035] for the definition of the two sub-band sets. Refer to paragraphs [0030] to [0033] together with the settings and equations of the two-section analysis filter bank (referring to paragraphs [0036] to [0038]) for executing the two said filter-bank computing procedures. Each of the sub-band signals consists of at least one sample.

In the two-section analysis filter bank 700, the two analysis filter banks 701 and 702 only enhance the stop-band attenuation of the frequency response of each of the sub-band equivalent filters on one side. In case of fewer sub-bands which makes the sub-bands wider, both the high-/low-frequency sides of the frequency response of each of the sub-band equivalent filters corresponding to a middle frequency range may face the issue of insufficient stopband attenuation. In a fourth embodiment of the present invention, a three-section analysis filter bank 800 is proposed to overcome the issue, where the three-section analysis filter bank 800 is composed of three said analysis filter banks in parallel.

Figure 8:
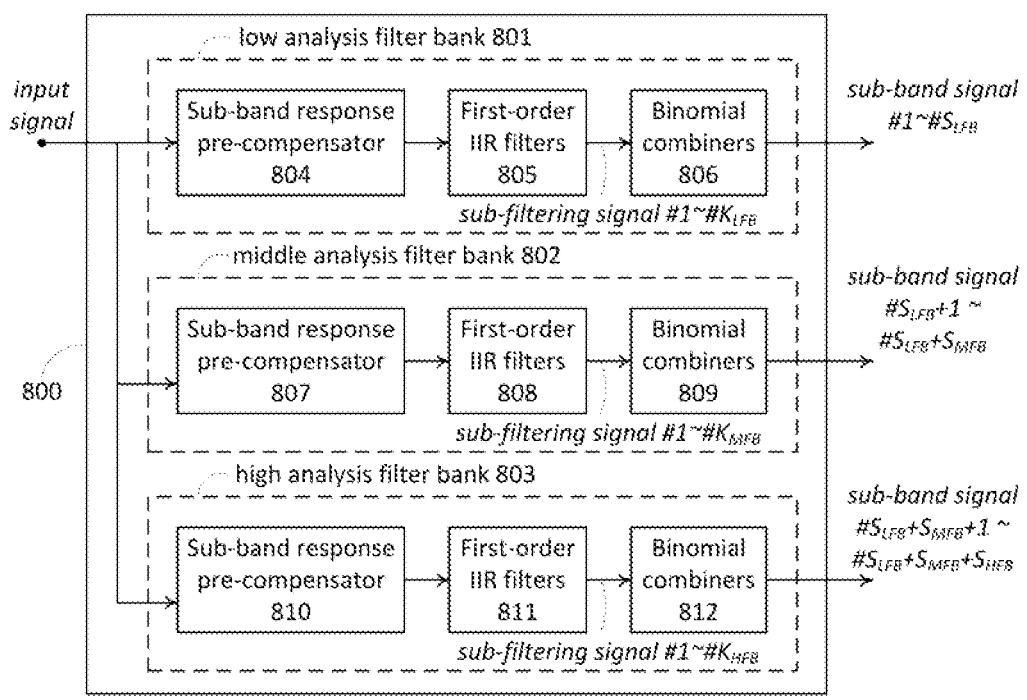
FIG. 8 is a block diagram of a three-section analysis filter bank according to a fourth embodiment of the present invention.

FIG. 8 is a block diagram of the three-section analysis filter bank 800, which comprises a low analysis filter bank 801, a middle analysis filter bank 802, and a high analysis filter bank 803. The three analysis filter banks respectively correspond to a low sub-band set, a middle sub-band set, and a high sub-band set, where the frequency ranges of the three sub-band sets are separated by a low boundary frequency $f_{BNDL}$ and a high boundary frequency $f_{BNDH}$. The low sub-band set consists of $S_L$ sub-bands with central frequencies are lower than $f_{BNDL}$, the middle sub-band set consists of $S_M$ sub-bands with central frequencies between $f_{BNDL}$ and $f_{BNDH}$, and the high sub-band set consists of $S_H$ sub-bands with central frequencies higher than $f_{BNDH}$. Each of the three sub-band sets can be configured as either unequal-width, equal-width, or partially-equal-width sub-bands. The three analysis filter banks 801, 802, and 803 perform frequency-division filtering respectively on an input signal to generate a plurality of sub-band signals.

In order to make the overall response of the three-section analysis filter bank 800 (including the gain response and group delay response) smooth and continuous at the two boundary frequencies, the following design constraints are added:

For each of the three analysis filter banks 801, 802, and 803, the binomially-combining and rotating devices are of $M^{th}$-order (i.e. based on $M^{th}$-order binomial weights), and two of the binomially-combining and rotating devices with consecutive No. (i.e. corresponding to any two of the sub-bands adjacent in central frequency) share P sub-filter signals.

The phase difference between two frequency responses of the two sub-band response pre-compensators 804, 807 at each frequency is a fixed value of integer multiple of $\pi/2$, and the phase difference between two frequency responses of the two sub-band response pre-compensators 807, 810 at each frequency is also a fixed value of an integer multiple of $\pi/2$ (to fulfill this, three linear-phase filters with identical group delay response can be employed as the three sub-band response pre-compensators). In this way, the two boundary frequencies $f_{BNDL}$ and $f_{BNDH}$ can be arbitrarily chosen without increasing the computation cost of the phase rotations of the binomial combining and rotating devices 806, 809, and 812.

The highest-central-frequency IIR sub-filter of the low analysis filter bank 801 and the lowest-central-frequency IIR sub-filter of the middle analysis filter bank 802 have identical central frequency and bandwidth settings, and the highest-central-frequency IIR sub-filter of the middle analysis filter bank 802 and the lowest-central-frequency IIR sub-filter of the high analysis filter bank 803 have identical central frequency and bandwidth settings, expressed as:

$$\begin{cases} f_{LIIR,K_L} = f_{MIIR,1} \\ BW_{LIIR,K_L} = BW_{MIIR,1} \end{cases} \quad (15)$$

$$\begin{cases} f_{MIIR,K_M} = f_{HIIR,1} \\ BW_{MIIR,K_M} = BW_{HIIR,1} \end{cases} \quad (16)$$

where $K_L$ and $K_M$ denote the number of IIR sub-filters of the low analysis filter bank 801 and the middle analysis filter bank 802 respectively, $f_{LIIR,K_L}$ and $BW_{LIIR,K_L}$ denote the central frequency and bandwidth of the No. $K_L$ IIR sub-filter of the low analysis filter bank 801 respectively; $f_{MIIR,1}$ and $BW_{MIIR,1}$ denote the central frequency and bandwidth of the No. 1 IIR sub-filter of the middle analysis filter bank 802 respectively; $f_{MIIR,K_M}$ and $BW_{MIIR,K_M}$ denote the central frequency and bandwidth of the No. $K_M$ IIR sub-filter of the middle analysis filter bank 802 respectively; and $f_{HIIR,1}$ and $BW_{HIIR,1}$ denote the central frequency and bandwidth of the No. 1 IIR sub-filter of the high analysis filter bank 803 respectively.

In the low analysis filter bank 801, the linear filtering of the sub-band response pre-compensator 804 is low-pass filtering to increase the out-of-band suppression of each of the sub-band equivalent filters of the low analysis filter bank 801 at the high-frequency side. In the middle analysis filter bank 802, the linear filtering of the sub-band response pre-compensator 807 is band-pass filtering to increase the out-of-band suppression of each of the sub-band equivalent filters of the middle analysis filter bank 802 at both the low-frequency and high-frequency sides. In the high analysis filter bank 803, the linear filtering of the sub-band response pre-compensator 810 is high-pass filtering to increase the out-of-band suppression of each of the sub-band equivalent filters of the high analysis filter bank 803 at the low-frequency side. The filtering operations of the three sub-band response pre-compensators 804, 807, and 810 can be respectively expressed as:

$$\hat{x}_L[n] = x[n] + 2 \cdot x[n-1] + x[n-2] \tag{17}$$

$$\hat{x}_M[n] = x[n] - x[n-2] \tag{18}$$

$$\hat{x}_H[n] = x[n] - 2 \cdot x[n-1] + x[n-2] \tag{19}$$

where $\hat{x}_L$ denotes the output signal of the sub-band response pre-compensator 804 of the low analysis filter bank 801, $\hat{x}_M$ denotes the output signal of the sub-band response pre-compensator 807 of the middle analysis filter bank 802, and $\hat{x}_H$ denotes the output signal of the sub-band response pre-compensator 810 of the high analysis filter bank 803, and other notations are as aforementioned.

In the low analysis filter bank 801, the $b_k$ settings of the IIR sub-filters 805 are modified to support the operation of the sub-band response pre-compensator 804 of equation (17):

$$b_k = \frac{\rho}{|1 + 2 \cdot e^{j\Omega} + e^{j \cdot 2\Omega}|} \cdot \left(\frac{BW_{LIIR,k}}{f_{SAM}}\right)^\mu, \Omega = 2\pi \cdot \frac{f_{LIIR,k}}{f_{SAM}} \tag{20}$$

where $f_{LIIR,k}$ and $BW_{LIIR,k}$ denote the central frequency and bandwidth of the No. k IIR sub-filter of the low analysis filter bank 801 respectively, and other notations are as aforementioned. The IIR sub-filters 805 are calculated according to equations (1), (2), and (20) (where $\hat{x}$ is substituted by $\hat{x}_L$), and the sub-band signals are calculated according to equations (4) to (6) (where the range of s is between $[1, S_L]$). Each sub-band signal of the low analysis filter bank 801 is the sub-band signal of the three-section analysis filter bank 800 with the same No.

In the middle analysis filter bank 802, the $b_k$ settings of the IIR sub-filters 808 are modified to support the operation of the sub-band response pre-compensator 807 of equation (18):

$$b_k = \frac{\rho}{|1 - e^{j \cdot 2\Omega}|} \cdot \left(\frac{BW_{MIIR,k}}{f_{SAM}}\right)^\mu, \Omega = 2\pi \cdot \frac{f_{MIIR,k}}{f_{SAM}} \tag{21}$$

where $f_{MIIR,k}$ and $BW_{MIIR,k}$ denote the central frequency and bandwidth of the No. k IIR sub-filter of the middle analysis filter bank 802 respectively, and other notations are as aforementioned. These IIR sub-filters 808 are calculated according to equations (1), (2), and (21) (where $\hat{x}$ is substituted by $\hat{x}_M$). The No. s sub-band signal of the middle analysis filter bank 802 is the No. $S_L$+s sub-band signal of the three-section analysis filter bank 800, calculated as:

$$\varphi_{M,s} = -\frac{\pi}{2} + \theta \cdot (S_L + s) \tag{22}$$

$$y_{FB,S_L+s}[n] = \exp(j\varphi_{M,s}) \cdot \sum_{m=0}^{M} B_{M,m} \cdot y_{MIIR,k_s+m}[n] \tag{23}$$

where $\varphi_{M,s}$ denotes the rotating phase of the No. s sub-band signal of the middle analysis filter bank 802, $k_s$ denotes the lowest No. of the sub-filter signals selected by the No. s combining and rotating device of the middle analysis filter bank 802, $y_{MIIR,k_s+m}$ denotes the No. $k_s$+m sub-filter signal of the middle analysis filter bank 802, $y_{FB,S_L+s}$ denotes the No. $S_L$+s sub-band signal of the three-section analysis filter bank 800, and other notations are as aforementioned. $B_{M,m}$ and $k_s$ are calculated according to equations (4) and (6) respectively (where the range of s is between $[1, S_M]$).

In the high analysis filter bank 803, the $b_k$ setting of the IIR sub-filters 811 are modified to support the operation of the sub-band response pre-compensator 810 of equation (19):

$$b_k = \frac{\rho}{|1 + 2 \cdot e^{j\Omega} + e^{j \cdot 2\Omega}|} \cdot \left(\frac{BW_{HIIR,k}}{f_{SAM}}\right)^\mu, \Omega = 2\pi \cdot \frac{f_{HIIR,k}}{f_{SAM}} \tag{24}$$

where $f_{HIIR,k}$ and $BW_{HIIR,k}$ denote the central frequency and bandwidth of the No. k IIR sub-filter of the high analysis filter bank 803 respectively, and other notations are as aforementioned. The IIR sub-filters 811 are calculated according to equations (1), (2), and (24) (where $\hat{x}$ is substituted by $\hat{x}_H$). The No. s sub-band signal of the high analysis filter bank 803 is the No. $S_L+S_M$+s sub-band signal of the three-section analysis filter bank 800, calculated as:

$$\varphi_{H,s} = -\pi + \theta \cdot (S_L + S_M + s) \tag{25}$$

$$y_{FB,S_L+S_M+s}[n] = \exp(j\varphi_{H,s}) \cdot \sum_{m=0}^{M} B_{M,m} \cdot y_{HIIR,k_s+m}[n] \tag{26}$$

where $\varphi_{H,s}$ denotes the rotating phase of the No. s sub-band signal of the high analysis filter bank 803, $k_s$ denotes the lowest No. of the sub-filter signals selected by the No. s combining and rotating device of the high analysis filter bank 803, $y_{HIIR,k_s+m}$ denotes the No. $k_s$+m sub-filter signal of the high analysis filter bank 803, $y_{FB,S_L+S_M+s}$ denotes the No. $S_L+S_M$+s sub-band signal of the three-section analysis filter bank 800, and other notations are as aforementioned. $B_{M,m}$ and $k_s$ are calculated according to equations (4) and (6) respectively (where the range of s is between $[1, S_H]$).

Note that in the design of the two-section analysis filter bank 700 and the three-section analysis filter bank 800, the feed-forward coefficients of the IIR sub-filters $b_k$ are determined not only by the bandwidth of the IIR sub-filter as shown in equation (3), but by both the bandwidth and the central frequency of the IIR sub-filter. Therefore, even if one of the analysis filter banks is configured with equal-width sub-bands, the computations of the IIR sub-filters cannot be simplified by sharing the feed-forward term as in the previous design.

In addition to be implemented as a physical device, the functions of the three-section analysis filter bank 800 can be realized by a three-section filter-bank computing procedure executed on at least one processor. The three-section filter-bank computing procedure executes three said filter-bank computing procedures corresponding to the three sub-band sets respectively on at least one sample of an input signal to obtain a plurality of sub-band signals. Refer to paragraph [0041] for the definition of the three sub-band sets. Refer to paragraphs [0030] to [0033] together with the settings and equations of the three-section analysis filter bank (referring to paragraphs [0042] to [0047]) for executing the three said filter-bank computing procedures. Each of the sub-band signals consists of at least one sample.

Figure 9:
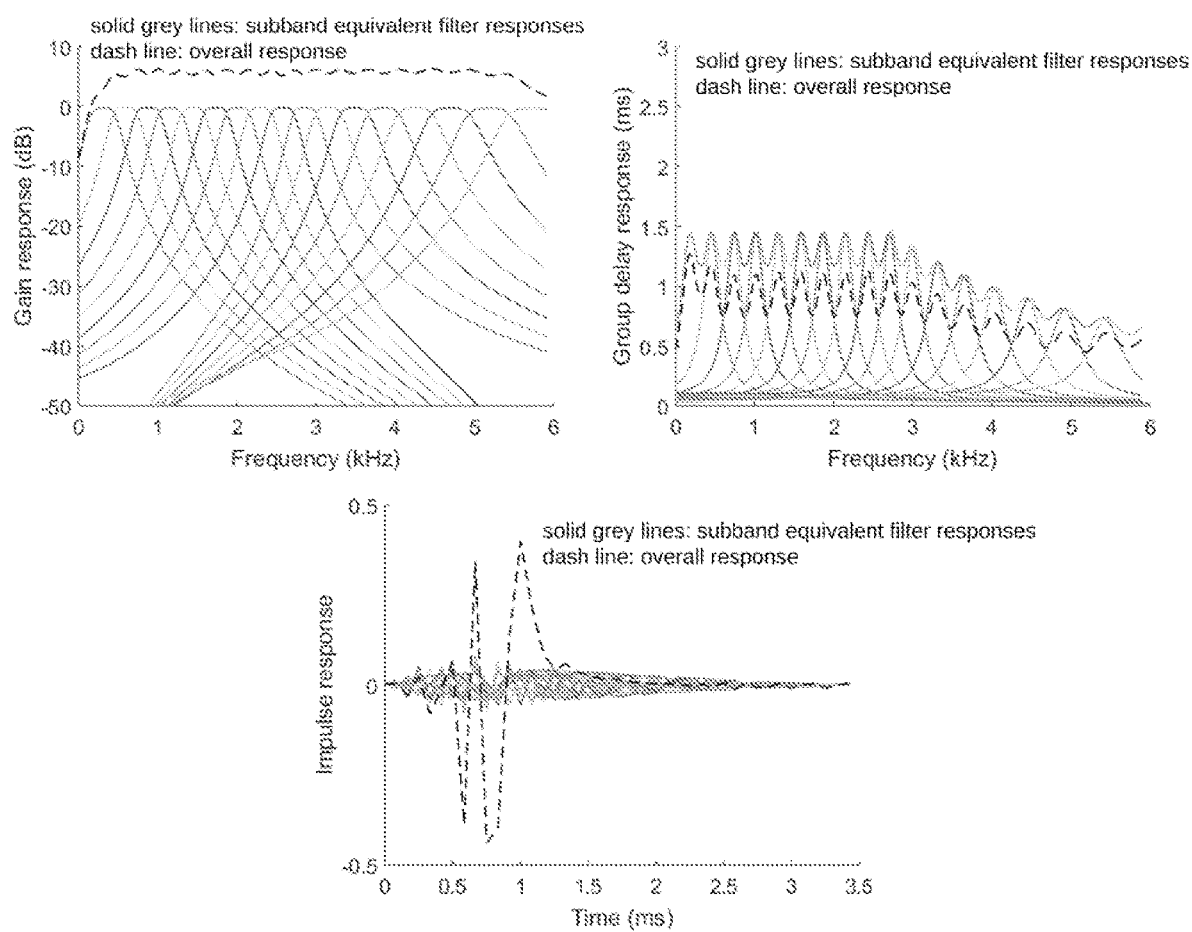
FIG. 9 is a set of response plots of a two-section analysis filter bank employing first-order binomially-combining and rotating devices.

FIG. 9 shows the responses of a two-section analysis filter bank configured with unequal-width sub-bands (the solid lines represent the frequency responses of the sub-band equivalent filters, and the dashed lines represent the overall response). First-order binomially-combining and rotating devices are employed in the two-section analysis filter bank. The sampling rate of the input signal of the analysis filter bank is set to 12 kHz. The analysis filter bank is configured with 7 unequal-width sub-bands per octave on the high-frequency side spectrum and equal-width sub-bands on the low-frequency side spectrum (e.g., there are 3 equal-width sub-bands below 1 kHz), so the frequency range from DC to the Nyquist frequency is divided into 17 sub-bands. Note the overall impulse response of this example is significantly distorted (i.e. far from an impulse function), which is totally different from that of said analysis filter bank with equal-width sub-bands. This is due to the high group delay variations of the sub-band equivalent filters caused by the highly different settings of the sub-band widths.

Figure 10:
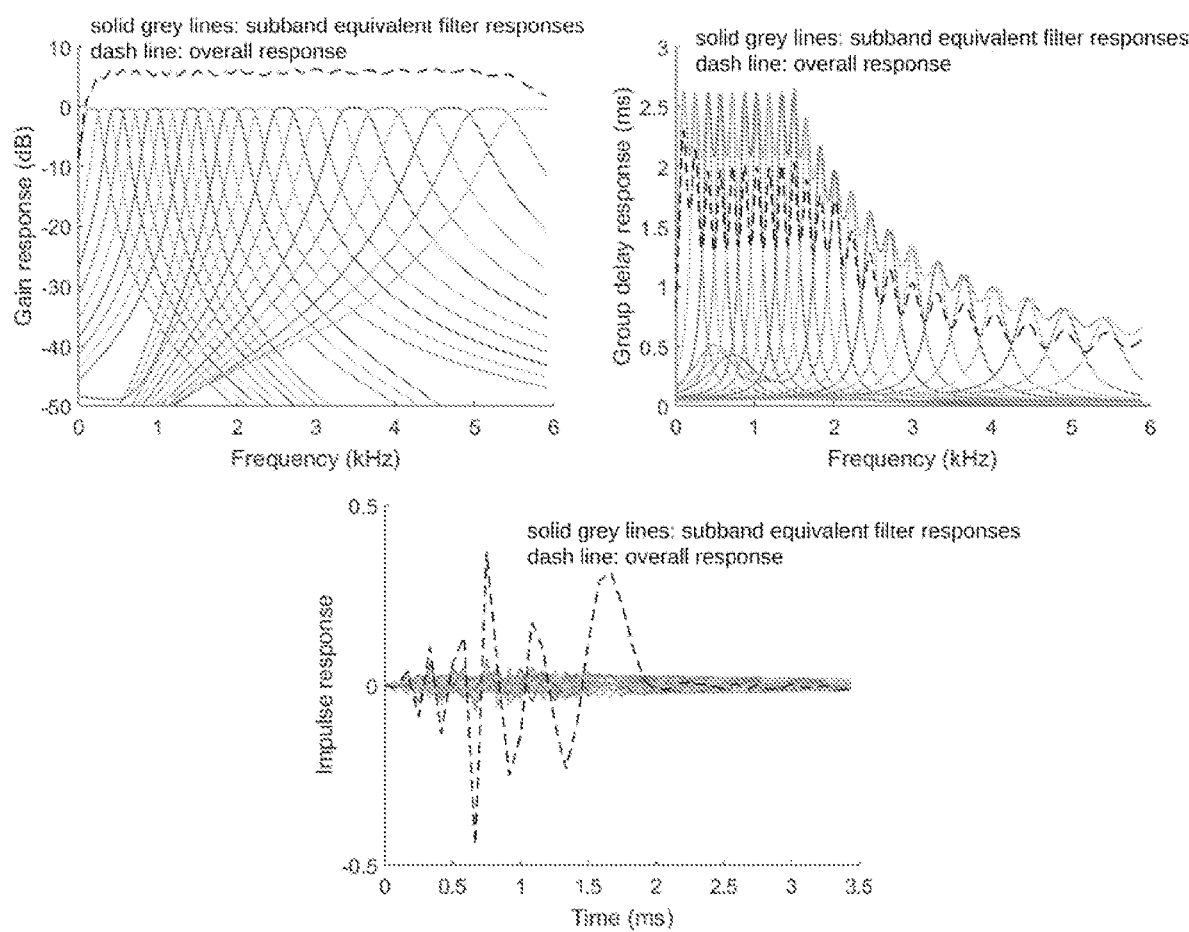
FIG. 10 is a set of response plots of another two-section analysis filter bank employing first-order binomially-combining and rotating devices.

FIG. 10 shows the responses of another two-section analysis filter bank configured with 7 unequal-width sub-bands per octave on the high-frequency side spectrum as the example of FIG. 9 but 6 equal-width sub-bands below 1 kHz. The resolution on the low-frequency side spectrum is nearly doubled, while the number of sub-bands (i.e. 23 sub-bands) is only increased by 6. Therefore, according to the application requirement, the analysis filter bank can be configured with unequal-width sub-bands to reduce the number of sub-bands while maintaining the resolution of the low-frequency part of the spectrum or the spectrogram (i.e. the plot of the spectrum versus time).

Figure 11:
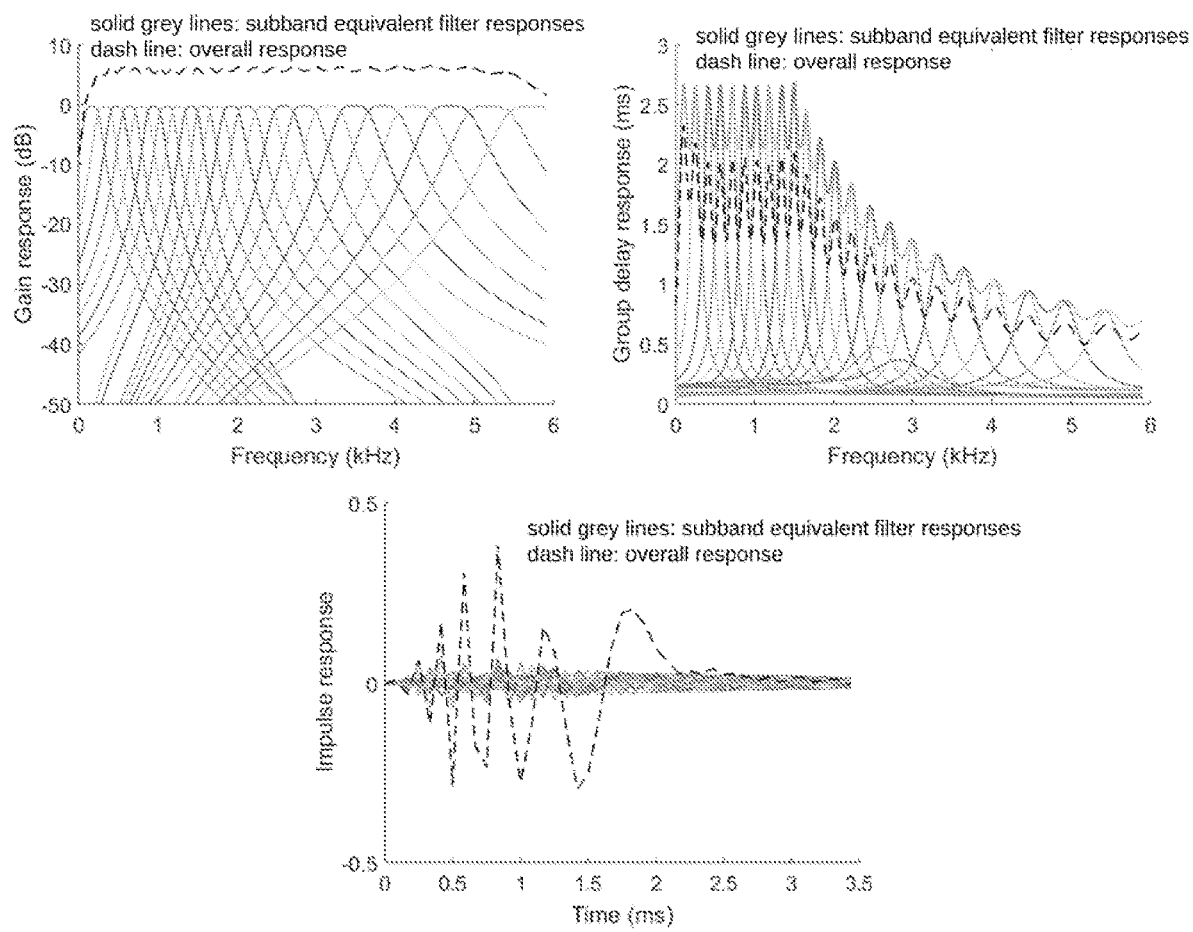
FIG. 11 is a set of response plots of a three-section analysis filter bank employing first-order binomially-combining and rotating devices.

FIG. 11 shows the responses of a three-section analysis filter bank with the same unequal-width sub-band configuration as the example of FIG. 10. In this example, the sub-band pre-compensators of the three-section analysis filter bank provide better stopband attenuations on the frequency responses of the sub-band equivalent filters corresponding to the middle-frequency to high-frequency sub-bands, while marginally increase the computation cost and the group delay of the overall response (by roughly one sample period, 0.083 ins).

Figure 12:
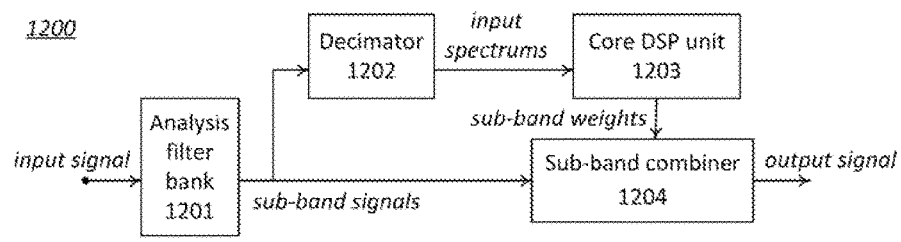
FIG. 12 is a block diagram of a filter-bank-based system architecture according to a fifth embodiment of the present invention.

FIG. 12 is a block diagram of a filter-bank-based system architecture according to a fifth embodiment of the present invention. The filter-bank-based system 1200 comprises an analysis filter bank 1201, a decimator 1202, a core DSP unit 1203, and a sub-band combiner 1204. The analysis filter bank 1201 performs frequency-division filtering corresponding to a plurality of sub-bands on an input signal (*) to generate a plurality of sub-band signals. For the implementation of the analysis filter bank 1201, either said analysis filter bank (referring to paragraphs 8 0016] to [0024]), the two-section analysis filter bank (referring to paragraphs [0035] to [0038]), or the three-section analysis filter bank (referring to paragraphs [0041] to [0046]) can be employed.

(*): In acoustic applications, the input signal is usually a digitized waveform, which may come from the output of an analog-digital converter, from a signal storage device, or further down-sampled (while the component over the audible frequency of the listener is preserved) with a down sampler before being inputted to the filter-bank-based system 1200. Down-sampling may save unnecessary computations on processing high-frequency sounds inaudible by the listener. In addition, it may prevent those high-frequency sounds from occupying the limited dynamic range of numerical calculations. In baseband signal processing applications, the input signal may come from the output of an analog-to-digital converter, or further down-sampled to preserve the in-band signal, to reject the out-of-band components, and to optimize the dynamic range of numerical calculations.

The decimator 1202 decimates the sub-band signals by a ratio N, i.e., arranges a plurality of concurrent samples of sub-band signals according to sub-band central frequency at each decimation period (N sample periods of the sub-band signals) to generate one of a plurality of input spectrums. The input spectrums can be expressed as: $Y_h=\{y_{FB,1}[hN], y_{FB,2}[hN], \ldots y_{FB,S}[hN]\}$, where $y_{FB,s}$ denotes the No. s sub-band signal of the analysis filter bank 1201 and h denotes the time index of the input spectrum. If the core DSP unit 1203 does not use the phase information, only the amplitudes (absolute values) of the sub-band signals are decimated, i.e. the concurrent samples of the sub-band signal amplitudes are arranged according to sub-band central frequency to generate one of the input spectrums, which is expressed as: $Y_h=\{|y_{FB,1}[hN]|, |y_{FB,2}[hN]|, \ldots |y_{FB,S}[hN]|\}$. Furthermore, to fulfill the Nyquist theorem and reduce the energy of aliasing components of the input spectrum, the frame rate of the input spectrum $f_{SAM}/N$ must be higher than the highest sub-band width.

The core DSP unit 1203 performs specified DSP operations on each of the input spectrums to determine a plurality of sub-band weights corresponding to the sub-bands of each sample time. The specified DSP operations may include various types of frequency-domain signal processing, such as equalization in baseband signal processing or acoustic signal processing, dynamic range compression, noise reduction, dereverberation, source separation, feedback reduction, or howling reduction in acoustic signal processing, etc. Each of said frequency-domain signal processing functions can be equivalent to multiply each frequency component of a spectrum with a weight to obtain a processed spectrum. The combination effect is also equivalent to multiply each frequency component of the input spectrum with a weight to obtain a corresponding modified spectrum. Therefore, the ratio of the modified spectrum value and the input spectrum value near each sub-band central frequency can be used to determine the sub-band weights.

The sub-band combiner 1204 performs a weighted summation on the sub-band signals with the sub-band weights to generate an output signal. The operation can be expressed as:

$$y[n] = \sum_{s=1}^{S} g_s[n] \cdot y_{FB,s}[n] \tag{27}$$

where $g_s$ denotes the sub-band weight corresponding to the No. s sub-band signal, y denotes the output signal of the filter-bank-based system 1200, and other notations are as aforementioned. The output signal is similar to the output signal obtained by the synthesis filter bank 105 of FIG. 1. Besides saving more computations against the synthesis filter bank 105, the sub-band combiner 1204 exhibits an advantage of zero group delay that avoids further increasing the delay time of the output signal as employing the synthesis filter bank 105. In acoustic applications, both the input signal and the output signal of a signal processing system are of real type. If each of the sub-band weights provided by the core DSP unit 1203 is of real type (i.e. without phase information), the weighted-summation can be simplified as multiplying the real part of each sub-band signal with the corresponding sub-band weight provided by the core DSP unit 1203 and summing the weighted terms accordingly:

$$y[n] = \sum_{s=1}^{S} g_s[n] \cdot \text{real}\{y_{FB,s}[n]\} \tag{28}$$

where real{·} denotes the function of taking the real part, and other notations are as aforementioned. If the sub-band weights provided by the core DSP unit 1203 are of complex type (i.e. with phase information), the sub-band signals can be multiplied by the corresponding weights provided by the core DSP unit 1203, and the real part values of the weighted terms are taken for summation:

$$y[n] = \sum_{s=1}^{S} \text{real}\{g_s[n] \cdot y_{FB,s}[n]\} \tag{29}$$

where the notations are as aforementioned.

Figure 13:
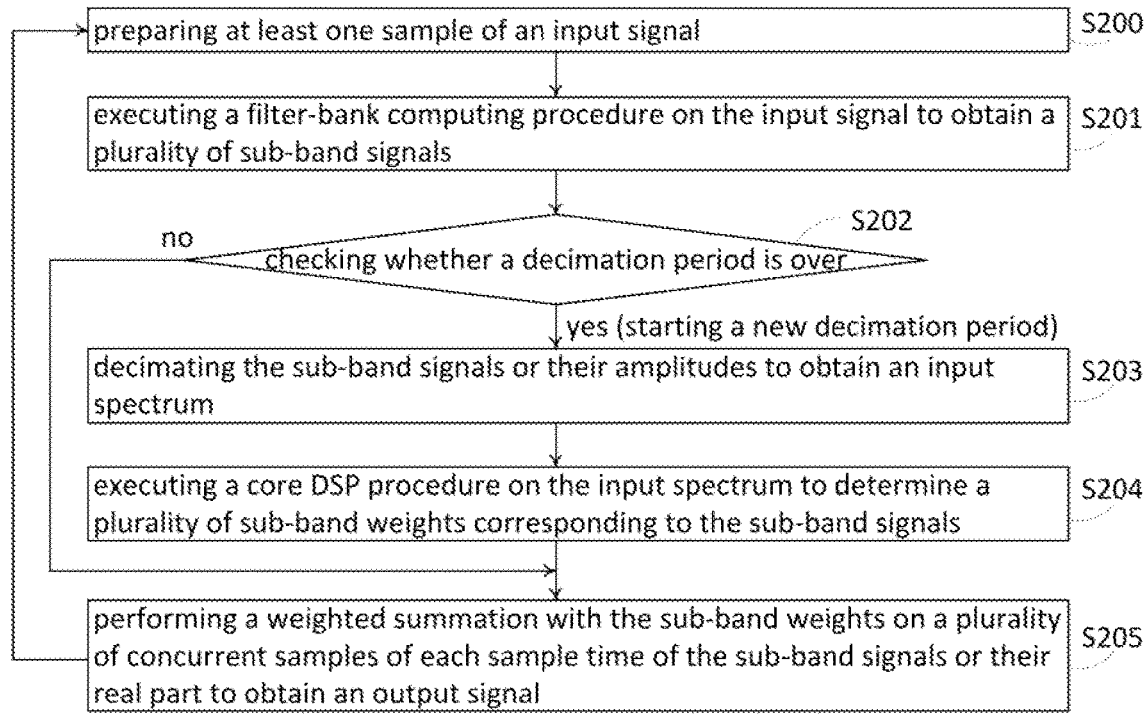
FIG. 13 is a flowchart of a filter-bank-based system procedure according to a sixth embodiment of the present invention.

In addition to be implemented as a physical device, the functions of the filter-bank-based system 1200 can be realized by an equivalent computing procedure executed on at least one processor. FIG. 13 is a flowchart of a filter-bank-based system procedure according to a sixth embodiment of the present invention. Because it is necessary for real-time signal processing applications to shorten the processing delay as much as possible, the flow steps repeatedly perform segmental operations on a continuous input signal. Each step processes an output signal segment just obtained by the previous step instead of waiting the entire output signal obtained by the previous step. In describing the flow steps of the filter-bank-based system procedure, the description in paragraphs [0052] to [0055] is referred.

In FIG. 13, at least one sample of an input signal is prepared (step S200).

A filter-bank computing procedure is executed on the input signal to obtain a plurality of sub-band signals (step S201). Either the said filter-bank computing procedure (referring to paragraphs [0030] to [0033]), the two-section filter-bank computing procedure (referring to paragraph [0039]), or the three-section filter-bank computing procedure (referring to paragraph [0048]) can be employed as the filter-bank computing procedure. Each of the sub-band signals consists of at least one sample.

Whether a decimation period is over or not is checked (step S202). If it is over, a new decimation period is started, and the flow is continued from step S203, otherwise the flow is continued from step S205.

The sub-band signals or their amplitudes are decimated to obtain an input spectrum (step S203). Referring to paragraph [0053], it implies to arrange a plurality of concurrent samples of the sub-band signals or their amplitudes according to sub-band central frequency to form the input spectrum.

A core DSP procedure is executed on the input spectrum to determine a plurality of sub-band weights corresponding to the sub-band signals (step S204). Referring to paragraph [0054], the core DSP procedure corresponds to the function of the core DSP unit 1203 of the fifth embodiment, which performs specified frequency-domain DSP operations on an input spectrum to obtain a modified spectrum. Therefore, the ratio of the modified spectrum value and the input spectrum value near each sub-band central frequency can be calculated to determine the sub-band weights.

A weighted summation with the sub-band weights is performed on a plurality of concurrent samples of each sample time of the sub-band signals or their real part to obtain an output signal, which consists of at least one sample (step S205). After that, the flow is returned to step S200. Referring to paragraph [0055], the weighted summation corresponds to the calculation of equation (27). If the output signal is of real type, the weighted summation can be simplified as the calculation of equation (29). If the sub-band weights determined by the core DSP procedure are of real type, the weighted summation can be expressed as the calculation of equation (28).

Because of employing the lowest-order IIR filters, sharing the filters between sub-bands, and employing the phase rotations without complex-type multiplication, the computation cost of the analysis filter bank proposed in the present invention is lower than that of the other types of analysis filter banks. Taking a filter-bank-based system with S sub-bands as an example. In case of employing first-order binomially-combining and rotating devices, the analysis filter bank obtains each output sample by taking S+1 complex-type multiplications for the feedback term of the IIR sub-filters, 1 to S+1 real-type multiplications for the feedforward term of the IIR sub-filters, a real-type multiplication for the sub-band response pre-compensator, and S real-type multiplications for the sub-band combiner (note the number of multiplications for the core DSP unit is not taken into count), which means that the filter-bank-based system only takes one complex-type multiplication and one or two real-type multiplications per sub-band per output sample on average. However, if the number of sub-bands is high or the order of the binomial is high, the computation cost of the filter-bank-based system is still significantly higher than that of the AMS-based system implemented by fast Fourier transform and its inverse transform. Hence there is still room for architecture improvement.

Figure 14:
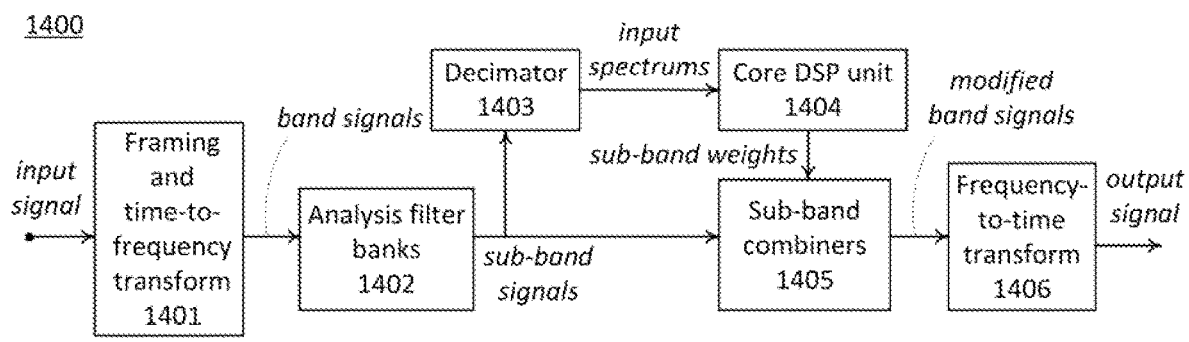
FIG. 14 is a block diagram of a hybrid-type signal processing system according to a seventh embodiment of the present invention.

FIG. 14 is a block diagram of a hybrid-type signal processing system according to a seventh embodiment of the present invention. The hybrid-type signal processing system 1400 comprises a framing and time-to-frequency transform device 1401, a plurality of analysis filter bank 1402, a decimator 1403, a core DSP unit 1404, a plurality of sub-band combiners 1405, and a frequency-to-time transform device 1406 . . . . Compared with the filter-bank-based system 1200 according to the fifth embodiment, the hybrid-type signal processing system 1400 is equipped with a time-frequency transform pair to further reduce computation cost. Each component of the hybrid-type signal processing system 1400 is described below.

The framing and time-to-frequency transform device 1401 divides an input signal into a plurality of signal frames with a frame length of R samples and a frame spacing of N samples (N≤R/2), and performs an R-point time-to-frequency transform (such as STFT, discrete Fourier transform, etc.) on each of the signal frames to generate one of a plurality of spectrums. The R-point time-to-frequency transform is equivalent to a frequency-division filtering operation of dividing the entire frequency range (DC to the sampling rate of the input signal $f_{SAM}$) into R equal-width frequency bands followed by a decimating-by-N operation. The samples corresponding to each frequency band forms one of the R band signals, where the sampling rate of the band signals is reduced to $f_{SAM}/N$. If an R-point STFT is used, it can be calculated as:

$$x_{BAND,g}[h] = \sum_{r=0}^{R-1} x[hN+r] \cdot W_{ANA}(r) \cdot \exp\left(-j \cdot \frac{2\pi r g}{R}\right), \quad (30)$$
$$\forall g \in [0, R-1]$$

where g denotes the frequency band No., h denotes the frame No., which is also the time index of the band signals, $x_{BAND,g}$ denotes the No. g band signal, x denotes the input signal, $W_{ANA}(\cdot)$ denotes the analysis window function in the R-point STFT which is non-zero if parameter r in the range of [0, R−1], and other notations are as aforementioned. For the detail of STFT and its inverse transform, please refer to reference documents 4 and 5. If the input is an acoustic signal, the system only needs to process the band signals corresponding to the single side spectrum including DC and Nyquist frequency, hence g in equation (30) is further limited to [0, R/2].

The analysis filter banks 1402 perform frequency-division filtering respectively on the band signals numbered from 0 to R−1 to generate a plurality of sub-band signals, wherein each analysis filter bank corresponds to a plurality of sub-bands subdivided from the frequency band of a band signal. For the implementation of the analysis filter banks 1402, please refer to the paragraphs of describing said analysis filter bank (paragraphs [0016] to [0024]), the two-section analysis filter bank (paragraphs [0035] to [0038]), and the three-section analysis filter bank (paragraphs [0041] to [0046]). If the input signal is of real type (such as an acoustic signal), the analysis filter banks 1402 only need to perform frequency-division filtering on the No. 0 to R/2 band signals corresponding to a single-side spectrum to generate the sub-band signals. The decimator 1403 decimates the sub-band signals or their amplitudes by a ratio M to generate one of a plurality of input spectrums. The frame rate of the input spectrums after decimation is reduced to $f_{SAM}/(MN)$, which must be higher than the highest sub-band width to fulfill the Nyquist theorem.

The core DSP unit 1404 performs specified frequency-domain signal processing on each of the input spectrums to determine a plurality of sub-band weights of the sub-band signals corresponding to each of the band signals (the function is the same as the core DSP unit 1203 according to the fifth embodiment).

Each of the sub-band combiners 1405 performs a weighted summation on the sub-band signals corresponding to one of the band signals with the corresponding sub-band weights (i.e. the sub-band weights of the sub-band signals corresponding to the band signal) to generate one of a plurality of modified band signals. This operation can be expressed as:

$$y_{BAND,g}[h] = \sum_{v=0}^{S_g} w_{g,v}[h] \cdot y_{FB,g,v}[h], \quad \forall g \in [0, R-1] \quad (31)$$

where $y_{BAND,g}$ denotes the No. g modified band signal, $S_g$ denotes the number of sub-bands corresponding to the No. g frequency band, $w_{g,v}$ is the sub-band weight for the No. v sub-band signal corresponding to the No. g frequency band, and other notations are as aforementioned. If the input signal is an acoustic signal, the modified band signals generated by the sub-band combiners 1405 only correspond to the frequency range of the single side spectrum, that is, g in equation (31) is further limited to [0, R/2].

Lastly, the frequency-to-time transform device 1406 perform an R-point frequency-to-time transform (which is an inverse transform of the R-point time-to-frequency transform) on R concurrent samples of the modified band signals of each frame to generate an output signal. If the output signal is of real type such as an acoustic signal, the complex conjugate of the modified band signals are used as the modified band signals on the symmetric side of the spectrum, expressed as:

$$y_{BAND,R-g}[h] = \overline{y_{BAND,g}[h]}, \forall g \in [1, R/2-1] \quad (32)$$

The R-point frequency-to-time transform may employ an R-point weighted overlap-add method (which is an inverse transform of the R-point STFT of equation (30)) to reconstruct the output signal, calculated as:

$$y_h[n] = \sum_{g=0}^{R-1} y_{BAND,g}[h] \cdot \exp\left(j \cdot \frac{2\pi g n}{R}\right) \quad (33)$$

$$y[n] = \sum_{h=-\infty}^{\infty} y_h[n-hN] \cdot W_{SYN}(n-hN) \quad (34)$$

where $y_h$ denotes the No. h modified signal frame, y denotes the output signal, $W_{SYN}(\cdot)$ denotes the synthesis window function of the R-point weighted overlap-add operation which is non-zero if parameter n−hN in the range of [0, R−1], and other notations are as aforementioned. If the output signal is acoustic signal, equation (33) can be simplified to only leave the real part of each term:

$$y_h[n] = \sum_{g=0}^{R-1} \text{real}\left\{y_{BAND,g}[h] \cdot \exp\left(j \cdot \frac{2\pi g n}{R}\right)\right\} \quad (35)$$

where the notations are as aforementioned.

In this system embodiment, the sampling rate of each analysis filter bank is reduced after the time-to-frequency transform. Compared with the last system embodiment under the same number of sub-bands, the computation cost of each sub-band in this embodiment can be greatly reduced. On the other hand, the signal processing delay of this system is the group delay of the analysis filter banks plus the delay of the time-frequency transform pair (which is about one frame period). Increasing the frame length/frame spacing of the time-frequency transform pair still increases the processing delay, hence the setting of the frame length depends on the designer's trade-off between the computational cost and the signal processing delay at the system level (e.g., an appropriate frame length may be set to reduce the computation cost of the hybrid-type system to be comparable with that of the AMS-based system implemented by STFT and its inverse transform, but just improve the signal processing delay to a certain level accepted by the listener).

The known limitations and the corresponding countermeasures of the filter-bank-based system architecture proposed in the present invention are as follows:

The frequency response overlapping of sub-band equivalent filters of the analysis filter bank may be significant due to parameter settings. Considering the case of any two consecutive numbered combining and rotating devices sharing a fixed number (P) of sub-filter signals, the lower-order binomial combining is employed, the higher degree of frequency response overlapping will be. Considering the case of employing a fixed-order combining, the greater P is set, the higher degree of frequency response overlapping will be. With the high degree of frequency response overlapping, the system may produce notable response errors when implementing a graphic equalizer (an equalizer that the gain values at multiple frequency points can be arbitrarily specified) or related functions. Taking an analysis filter bank employing the first-order binomial combining as an example, if a single sub-band signal is removed when combining sub-band signals, the overall response attenuation at the corresponding sub-band central frequency will be less than 10 dB. To perform a notching function (i.e., to provide a high frequency response attenuation near a specific frequency point), it is necessary to reduce the gains of multiple sub-bands adjacent in frequency to achieve such effect.

The limited frequency selectivity (manifested in not-narrow transition band plus limited stopband attenuation) and the nonlinear phase response of each of the sub-band equivalent filters also make the system produce notable response errors when implementing a graphic equalizer or related functions. Considering that the core DSP unit may provide gains on some sub-bands much higher (e.g. >20 dB) than that on their adjacent sub-bands, the overall response of the analysis filter bank in the sub-bands adjacent to high gain sub-bands may be far from expected. Therefore, if it is necessary to highly increase the gains, e.g. in case of a signal processing algorithm (such as a wide dynamic range compression increasing the sub-band weights, it is recommended to increase the number of sub-bands to make the gain change more smoothly over sub-band. For example, when compensating the severe high-frequency hearing loss, the number of high-frequency sub-bands can be increased to reduce the difference of the weights between adjacent sub-bands.

Figure 1:
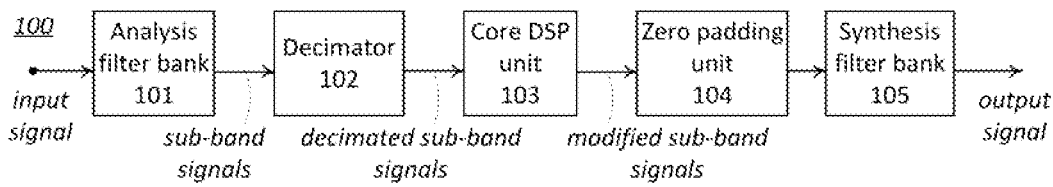
FIG. 1 is a block diagram of a conventional filter-bank-based signal processing system architecture.

Due to the absence of a synthesis filter bank in said filter-bank-based system architecture, there is no anti-aliasing function provided by a synthesis filter bank as that of FIG. 1. Therefore, it is recommended to slow down the speed of sub-band weight adjustment over time.

Figure 15:
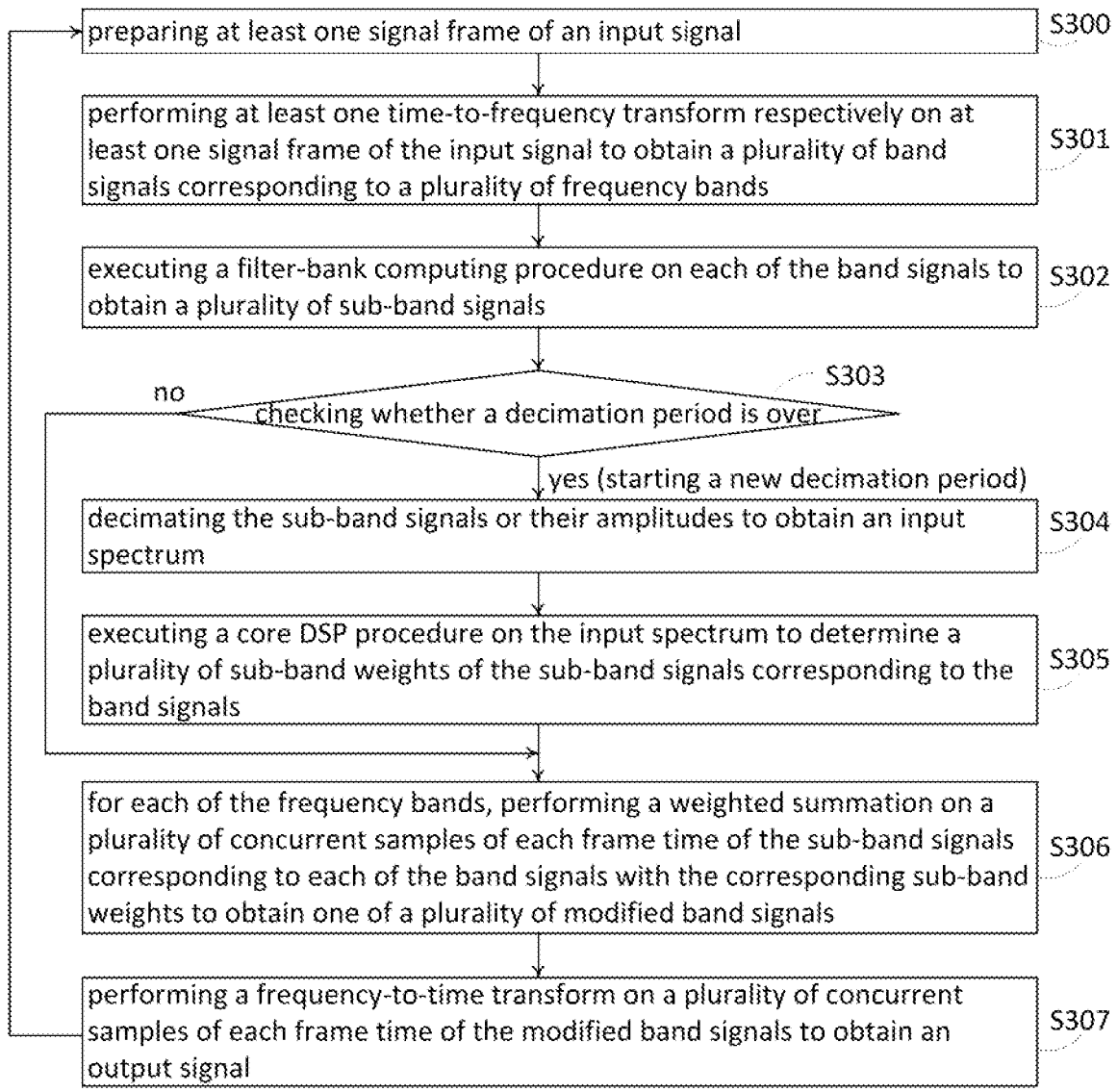
FIG. 15 is a flowchart of a hybrid-type signal processing system procedure according to an eighth embodiment of the present invention.

In addition to be implemented as a physical device, the functions of the hybrid-type signal processing system 1400 can be realized by an equivalent computing procedure executed on at least one processor. FIG. 15 is a flowchart of a hybrid-type signal processing system procedure according to an eighth embodiment of the present invention. In describing the flow steps of the hybrid-type signal processing system procedure, the description in paragraphs [0065] to [0069] is referred.

In FIG. 15, at least one signal frame of an input signal is prepared (step S300).

At least one time-to-frequency transform is performed respectively on the at least one signal frame of the input signal to obtain a plurality of band signals corresponding to a plurality of frequency bands (step S301). The time-to-frequency transform corresponds to the calculation of equation (30), which can refer to paragraph [0065]. Each of the band signals consists of at least one sample.

A filter-bank computing procedure is respectively executed on each of the band signals to obtain a plurality of sub-band signals (step S302). Referring to paragraph [0066], the filter-bank computing procedure corresponds to a plurality of sub-bands subdivided from the frequency band of a band signal. Either the aforementioned filter-bank computing procedure (refer to paragraphs [0030] to [0033]), the two-section filter-bank computing procedure (refer to paragraph [0039]), or the three-section filter-bank computing procedure (refer to paragraph [0048]) can be employed as the filter-bank computing procedure. Each of the sub-band signals consists of at least one sample.

Whether a decimation period is over or not is checked (step S303). If it is over, a new decimation period is started, and the flow is continued from step S304, otherwise the flow is continued from step S306.

An input spectrum is obtained by decimating the sub-band signals or their amplitudes (step S304). As in step S203 of the sixth embodiment of the present invention, the step is to arrange a plurality of concurrent samples of sub-band signals or their amplitudes according to frequency to form the input spectrum.

A core DSP procedure is executed on the input spectrum to determine a plurality of sub-band weights of the sub-band signals corresponding to the band signals (step S305). The function of this procedure is the same as the core DSP procedure of the sixth embodiment of the present invention.

For each of the frequency bands, a weighted summation with the corresponding sub-band weights is performed on a plurality of concurrent samples of each frame time of the corresponding sub-band signals to obtain one of a plurality of modified band signals (S306), which consists of at least one sample. The weighted summation corresponds to the calculation of equation (31).

A frequency-to-time transform is performed on a plurality of concurrent samples of each frame time of the modified band signals to obtain an output signal (S307), which consists of a plurality of samples. After that, the flow is returned to step S300. Referring to paragraph [0069], the frequency-to-time transform corresponds to the calculations of equations (32) to (35).

Although the present invention has been described above with reference to the preferred embodiments and the accompanying drawings, it shall not be considered as limited. Those skilled in the art can make various modifications, omissions and changes to the details of the embodiments of the present invention without departing from the scope of the claims of the invention.

What is claimed is:

1. An analysis filter bank corresponding to a plurality of sub-bands, wherein the analysis filter bank performs frequency-division filtering on an input signal to generate a plurality of sub-band signals, the analysis filter bank comprising:

a sub-band response pre-compensator, which performs linear filtering on the input signal to generate a response pre-compensated signal;

a plurality of sub-filters with different central frequencies, which perform complex-type first-order infinite impulse response (IIR) filtering respectively on the response pre-compensated signal to generate a plurality of sub-filter signals; and a plurality of binomially-combining and rotating devices based on a set of binomial weights, each of which performs a weighted summation on at least two number of the sub-filter signals with the set of binomial weights, and rotates a result of the weighted-summation with a rotating phase according to a corresponding sub-band central frequency to generate one of the sub-band signals, or each of the binomially-combining and rotating devices rotates the at least two number of the sub-filter signals respectively with a rotating phase according to a corresponding sub-band central frequency and performs a weighted summation on at least two number rotating results with the set of binomial weights to generate one of the sub-band signals, wherein the at least two number of the sub-filter signals are generated by the at least two number of the sub-filters adjacent in central frequency;

wherein the set of binomial weights is defined as a coefficient set of polynomial expansion of $(1-x)^M$ given by:

$B_{M,m}=(-1)^m \cdot M!/m!(M-m)!$, $M \geq 1, 0 \leq m \leq M$, and $B_{M,m}$ denotes the $m^{th}$ coefficient of the set of binomial weights.

2. The analysis filter bank according to claim 1, wherein two of the binomially-combining and rotating devices corresponding to any two of the sub-bands adjacent in central frequency share at least one of the sub-filter signals.

3. The analysis filter bank according to claim 2, wherein the difference between the rotating phases of two of the binomially-combining and rotating devices corresponding to any two of the sub-bands adjacent in central frequency is an integer multiple of $-\pi/2$ radian.

4. The analysis filter bank according to claim 3, wherein the sub-bands are in equal width, and the linear filtering of the sub-band response pre-compensator is performed by summing the input signal and a weighted-and-delayed version thereof.

5. A two-section analysis filter bank, comprising two analysis filter banks according to claim 1 as:

a low analysis filter bank, which corresponds to a low sub-band set consisting of a plurality of sub-bands with central frequencies lower than a boundary frequency; and a high analysis filter bank, which corresponds to a high sub-band set consisting of a plurality of sub-bands with central frequencies not lower than the boundary frequency, wherein the two analysis filter banks perform frequency-division filtering respectively on an input signal to generate a plurality of sub-band signals, the linear filtering of the sub-band response pre-compensator of the low analysis filter bank is low-pass filtering, and the linear filtering of the sub-band response pre-compensator of the high analysis filter bank is high-pass filtering.

6. The two-section analysis filter bank according to claim 5, wherein, for each of the two analysis filter banks, the binomially-combining and rotating devices are based on the same set of binomial weights, and two of the binomially-combining and rotating devices corresponding to any two of the sub-bands adjacent in central frequency share the same number of the sub-filter signals.

7. The two-section analysis filter bank according to claim 6, wherein the phase difference between two frequency responses of the two sub-band response pre-compensators of the two analysis filter banks at each frequency is a fixed value of integer multiple of $-\pi/2$ radian.

8. The two-section analysis filter bank according to claim 7, wherein a sub-filter of the low analysis filter bank with a highest central frequency and a sub-filter of the high analysis filter bank with a lowest central frequency have identical central frequency and bandwidth settings.

9. A three-section analysis filter bank, comprising three analysis filter banks according to claim 1 as:

a low analysis filter bank, which corresponds to a low sub-band set consisting of a plurality of sub-bands with central frequencies lower than a low boundary frequency;

a middle analysis filter bank, which corresponds to a middle sub-band set consisting of a plurality of sub-bands with central frequencies between the low boundary frequency and a high boundary frequency; and a high analysis filter bank, which corresponds to a high sub-band set consisting of a plurality of sub-bands with central frequencies higher than the high boundary frequency, wherein the three analysis filter banks perform frequency-division filtering respectively on an input signal to generate a plurality of sub-band signals, the linear filtering of the sub-band response pre-compensator of the low analysis filter bank is low-pass filtering, the linear filtering of the sub-band response pre-compensator of the middle analysis filter bank is band-pass filtering, and the linear filtering of the sub-band response pre-compensator of the high analysis filter bank is high-pass filtering.

10. The three-section analysis filter bank according to claim 9, wherein, for each of the three analysis filter banks, the binomially-combining and rotating devices are based on the same set of binomial weights, and two of the binomially-combining and rotating devices corresponding to any two of the sub-bands adjacent in central frequency share the same number of the sub-filter signals.

11. The three-section analysis filter bank according to claim 10, wherein the phase difference between two frequency responses of the two sub-band response pre-compensators of any two of the three analysis filter banks at each frequency is a fixed value of an integer multiple of $-\pi/2$ radian.

12. The three-section analysis filter bank according to claim 11, wherein a sub-filter of the low analysis filter bank with a highest central frequency and a sub-filter of the middle analysis filter bank with a lowest central frequency have identical central frequency and bandwidth settings, and a sub-filter of the middle analysis filter bank with a highest central frequency and a sub-filter of the high analysis filter bank with a lowest central frequency have identical central frequency and bandwidth settings.

13. A filter-bank-type signal processing system, comprising:

an analysis filter bank according to claim 1, which performs frequency-division filtering on an input signal to generate a plurality of sub-band signals;

a decimator, which decimates the sub-band signals or their amplitudes by a decimation ratio to generate an input spectrum;

a core digital signal processing (DSP) unit, which performs specified DSP operations on the input spectrum to determine a plurality of sub-band weights corresponding to the sub-band signals; and a sub-band combiner, which performs a weighted summation on the sub-band signals or their real part with the sub-band weights to generate an output signal.

14. A hybrid-type signal processing system, comprising:
a plurality of analysis filter banks according to claim 1, which perform frequency-division filtering respectively on a plurality of band signals to generate a plurality of sub-band signals;
a framing and time-to-frequency transform device, which divides an input signal into a plurality of signal frames with equal frame length and equal frame spacing in time and performs a time-to-frequency transform on each of the signal frames to generate the band signals;
a decimator, which decimates the sub-band signals or their amplitudes by a decimation ratio to generate an input spectrum;
a core DSP unit, which performs specified frequency-domain signal processing on the input spectrum to determine a plurality of sub-band weights of the sub-band signals corresponding to each of the band signals;
a plurality of sub-band combiners, each of which performs a weighted summation on the sub-band signals corresponding to one of the band signals with the sub-band weights of the sub-band signals corresponding to the band signal to generate one of a plurality of modified band signal; and
a frequency-to-time transform device, which performs a frequency-to-time transform on a plurality of concurrent samples of the modified band signals to generate an output signal.

15. A filter-bank computing procedure corresponding to a plurality of sub-bands, comprising the following steps:
performing a linear filtering operation on an input signal to obtain a response pre-compensated signal;
performing a plurality of complex-type first-order IIR filtering operations with different central frequencies respectively on the response pre-compensated signal to obtain a plurality of sub-filter signals; and
for each of a plurality of subsets of the sub-filter signals, performing a weighted summation on at least two number of concurrent samples with a set of binomial weights, and rotating a result of the weighted-summation with a rotating phase according to a corresponding sub-band central frequency to obtain one of a plurality of sub-band signals, or
for each of the subsets of the sub-filter signals, rotating the at least two number of concurrent samples with a rotating phase according to a corresponding sub-band central frequency, and performing a weighted summation on at least two number of rotated samples with a set of binomial weights to obtain one of the sub-band signals,
wherein the subsets of the sub-filter signals respectively correspond to the sub-bands, each subset of the sub-filter signals consists of at least two number of the sub-filter signals obtained by the at least two number of the sub-filters adjacent in central frequency;
wherein the set of binomial weights is defined as a coefficient set of polynomial expansion of $(1-x)^M$ given by:

$B_{M,m} = (-1)^m \cdot M!/m!(M-m)!$, $M \geq 1.0 \leq m \leq M$, and $B_{M,m}$ denotes the $m^{th}$ coefficient of the set of binomial weights.

16. The filter bank computing procedure according to claim 15, wherein two of the subsets of the sub-filter signals corresponding to any two sub-bands adjacent in central frequency share at least one of the sub-filter signals.

17. The filter bank computing procedure according to claim 16, wherein the difference between two rotating phases corresponding to any two sub-bands adjacent in central frequency is an integer multiple of $-\pi/2$ radian.

18. The filter bank computing procedure according to claim 17, wherein the sub-bands are in equal width, and the linear filtering operation is performed by summing the input signal and a weighted-and-delayed version thereof.

19. A processing procedure of filter-bank-based signal processing system, comprising the following steps:
executing the filter-bank computing procedure according to claim 15 on an input signal to obtain a plurality of sub-band signals;
decimating the sub-band signals or their amplitudes to obtain an input spectrum, and executing a core DSP procedure on the input spectrum to determine a plurality of sub-band weights corresponding to the sub-band signals; and
performing a weighted summation with the sub-band weights on a plurality of concurrent samples of the sub-band signals or their real part to obtain an output signal.

20. A processing procedure of hybrid-type signal processing system, comprising the following steps:
performing at least one time-to-frequency transform respectively on at least one signal frame of an input signal to obtain a plurality of band signals corresponding to a plurality of frequency bands;
executing the filter-bank computing procedure according to claim 15 on each of the band signals to obtain a plurality of sub-band signals;
decimating the sub-band signals or their amplitudes to obtain an input spectrum, and executing a core DSP procedure on the input spectrum to determine a plurality of sub-band weights of the sub-band signals corresponding to the band signals;
for each of the frequency bands, performing a weighted summation on a plurality of concurrent samples of the sub-band signals corresponding to each of the band signals with the corresponding sub-band weight to obtain one of a plurality of modified band signals; and
performing a frequency-to-time transform on a plurality of concurrent samples of the modified band signals to obtain an output signal.

* * * * *